(12) United States Patent
Murao et al.

(10) Patent No.: US 11,195,961 B2
(45) Date of Patent: Dec. 7, 2021

(54) SOLAR CELL ELEMENT

(71) Applicant: KYOCERA CORPORATION, Kyoto (JP)

(72) Inventors: Akira Murao, Moriyama (JP); Norihiko Matsushima, Yasu (JP)

(73) Assignee: KYOCERA CORPORATION, Kyoto (JP)

(*) Notice: Subject to any disclaimer, the term of this patent is extended or adjusted under 35 U.S.C. 154(b) by 101 days.

(21) Appl. No.: 16/365,551

(22) Filed: Mar. 26, 2019

(65) Prior Publication Data

US 2019/0221688 A1 Jul. 18, 2019

Related U.S. Application Data

(63) Continuation of application No. PCT/JP2017/034704, filed on Sep. 26, 2017.

(30) Foreign Application Priority Data

Sep. 28, 2016 (JP) .............................. JP2016-189501

(51) Int. Cl.
*H01L 31/0224* (2006.01)
*H01L 31/0216* (2014.01)
(Continued)

(52) U.S. Cl.
CPC .. *H01L 31/022441* (2013.01); *H01L 31/0201* (2013.01); *H01L 31/02167* (2013.01);
(Continued)

(58) Field of Classification Search
CPC .................... H01L 31/022441; H01L 31/0201
See application file for complete search history.

(56) References Cited

U.S. PATENT DOCUMENTS

2011/0197964 A1* 8/2011 Jang ...................... H01L 31/068
136/256
2011/0284060 A1* 11/2011 Lee ................. H01L 31/035281
136/255
(Continued)

FOREIGN PATENT DOCUMENTS

JP 2013-033819 A 2/2013
JP 2015-159276 A 9/2015
(Continued)

*Primary Examiner* — Sadie White
(74) *Attorney, Agent, or Firm* — Duane Morris LLP

(57) ABSTRACT

The solar cell element includes a semiconductor substrate with first and second surfaces, a passivation layer being in contact with the second surface, a protective layer located on the passivation layer, a bus bar electrode, and a collecting electrode. The bus bar electrode is in contact with the second surface in a first gap portion penetrating the passivation layer and the protective layer, and is sandwiching a gap region with the passivation layer and the protective layer in a first direction along the second surface. The collecting electrode includes an electrode layer located on the protective layer, a first connecting portion located in the gap region and connecting the electrode layer and the second surface, and a second connecting portion penetrating the passivation layer and the protective layer and connecting the electrode layer and the second surface in a second gap, and is electrically connected with the bus bar electrode.

8 Claims, 12 Drawing Sheets

(51) Int. Cl.
*H01L 31/02* (2006.01)
*H01L 31/068* (2012.01)

(52) U.S. Cl.
CPC .... *H01L 31/022425* (2013.01); *H01L 31/068* (2013.01); *Y02E 10/50* (2013.01)

(56) References Cited

U.S. PATENT DOCUMENTS

| | | | |
|---|---|---|---|
| 2012/0180860 A1* | 7/2012 | Ko | H01L 31/022425 |
| | | | 136/256 |
| 2013/0337604 A1* | 12/2013 | Ozawa | H01L 31/18 |
| | | | 438/98 |
| 2013/0340804 A1* | 12/2013 | Moon | H01L 31/0547 |
| | | | 136/244 |
| 2014/0041720 A1* | 2/2014 | Yang | H01L 31/02167 |
| | | | 136/256 |
| 2017/0194519 A1 | 7/2017 | Matsushima et al. | |

FOREIGN PATENT DOCUMENTS

| | | |
|---|---|---|
| JP | 2016-058438 A | 4/2016 |
| WO | 2016/047564 A1 | 3/2016 |

* cited by examiner

F I G . 1
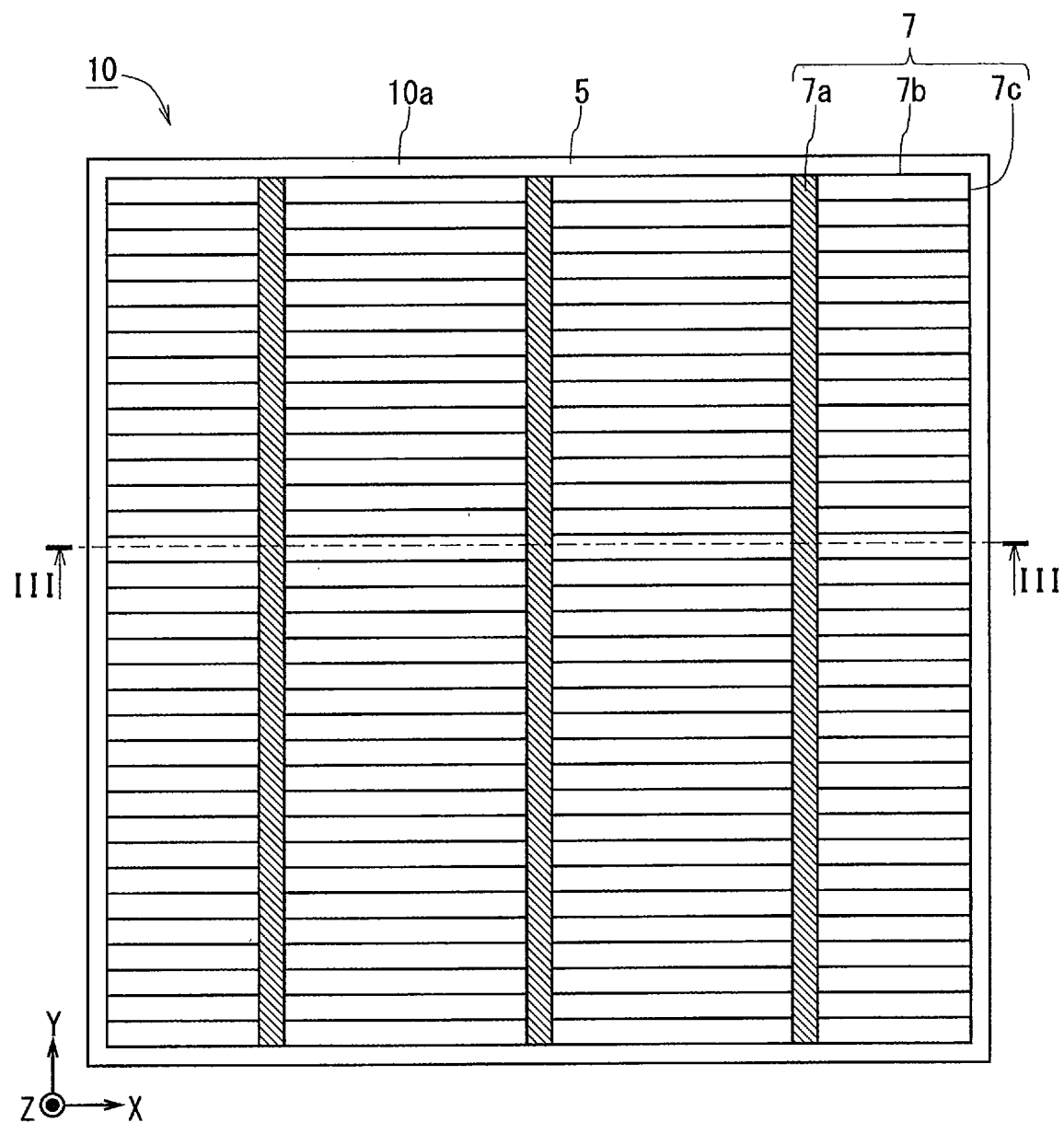

III-III

F I G. 1 2
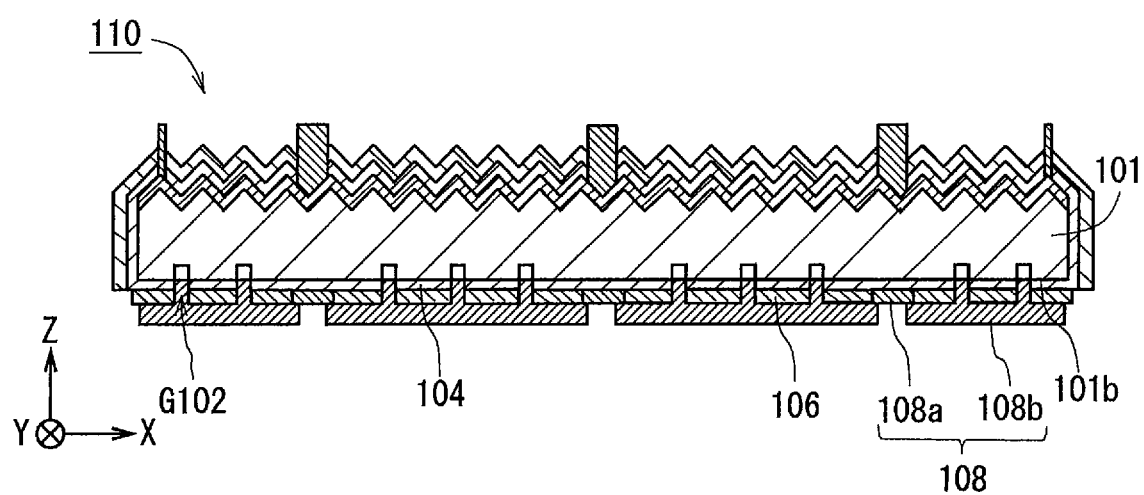

SOLAR CELL ELEMENT

CROSS-REFERENCE TO RELATED APPLICATIONS

The present application is a continuation based on PCT Application No. PCT/JP2017/034704 filed on Sep. 26, 2017, which claims the benefit of Japanese Application No. 2016-189501, filed on Sep. 28, 2016. PCT Application No. PCT/JP2017/034704 is entitled "SOLAR BATTERY ELEMENT", and Japanese Application No. 2016-189501 is entitled "SOLAR BATTERY ELEMENT". The contents of which are incorporated by reference herein in their entirety.

FIELD

The present disclosure relates to a solar cell element.

BACKGROUND

Solar cell elements include PERC (Passivated Emitter and Rear Cell) type solar cell elements. The PERC type solar cell element has a structure in which a passivation layer, a protective layer, and a back-surface collecting electrode are stacked in this order on the back surface of a semiconductor substrate. Here, the back-surface collecting electrode is connected with the back surface of the semiconductor substrate in a hole portion (also referred to as a contact hole) penetrating the passivation layer and the protective layer. Further, the back-surface collecting electrode is connected to a back-surface bus bar electrode located on the semiconductor substrate. Thereby, a photocurrent generated by photoelectric conversion in the semiconductor substrate can be output by a wiring material connected to the back-surface bus bar electrode via the back-surface collecting electrode and the back-surface bus bar electrode.

SUMMARY

A solar cell element is disclosed.

In one aspect, a solar cell element includes a semiconductor substrate, a passivation layer, a protective layer, a back-surface bus bar electrode, and a back-surface collecting electrode. The semiconductor substrate has a first surface and a second surface opposite the first surface. The passivation layer is in contact with the second surface. The protective layer is located on the passivation layer. The back-surface bus bar electrode is in contact with the second surface in a first gap portion penetrating the passivation layer and the protective layer. The back-surface bus bar electrode is located in the first gap portion in a state of defining a gap region with the passivation layer and the protective layer in a first direction along the second surface. The back-surface collecting electrode includes an electrode layer portion, a first connecting portion, and a second connecting portion. The electrode layer portion is located on the protective layer. The first connecting portion is located in the gap region and connects the electrode layer portion and the second surface. The second connecting portion is located in a second gap portion that penetrates the passivation layer and the protective layer and is different from the first gap portion, and connects the electrode layer portion and the second surface. The back-surface collecting electrode is electrically connected with the back-surface bus bar electrode.

BRIEF DESCRIPTION OF DRAWINGS

FIG. 1 illustrates a plan view showing an appearance of a first surface side of an example of a solar cell element according to a first embodiment.

FIG. 12 illustrates a cross-sectional view showing an example of a cross section of a solar cell element according to the reference example.

DESCRIPTION OF EMBODIMENTS

Figure 2:
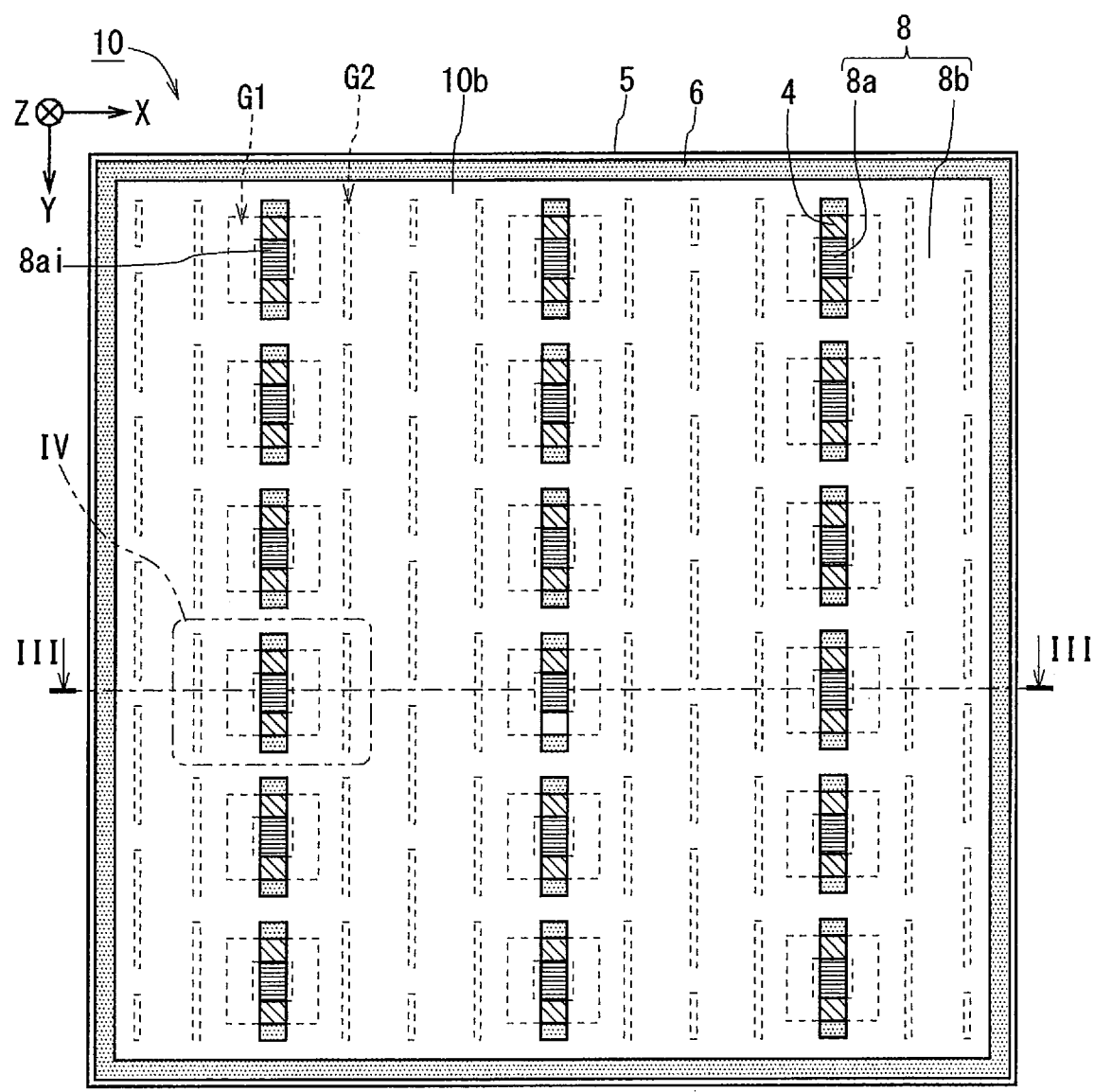
FIG. 2 illustrates a plan view showing an appearance of a second surface side of an example of the solar cell element according to the first embodiment.

As shown in FIG. 12, a PERC type solar cell element 110 has a structure in which a passivation layer 104, a protective layer 106, and a back-surface collecting electrode 108b are stacked in this order on a back surface 101b of a semiconductor substrate 101. Here, the back-surface collecting electrode 108b is electrically connected with the back surface 101b of the semiconductor substrate 101 at a conductive portion in a gap (also referred to as a contact hole) G102 penetrating the passivation layer 104 and the protective layer 106. In addition, the back-surface collecting electrode 108b is connected to a back-surface bus bar electrode 108a located on the semiconductor substrate 101.

When the PERC type solar cell element 110 is manufactured, for example, the passivation layer 104 and the protective layer 106 are formed in this order on the back surface 101b side of the semiconductor substrate 101. Further, for example, on the back surface 101b of the semiconductor substrate 101, a back-surface electrode 108 including the back-surface bus bar electrode 108a and the back-surface collecting electrode 108b is formed. The protective layer 106 protects a part of the passivation layer 104 by covering the part of the passivation layer 104 when the back-surface collecting electrode 108b is formed. As the protective layer 106, for example, an oxide film comprised of silicon oxide or the like, a nitride film comprised of silicon nitride or the like, or a film formed by stacking an oxide film and a nitride film can be adopted. On the semiconductor substrate 101, the back-surface bus bar electrode 108a is provided continuously or intermittently along one direction.

Normally, the passivation layer 104 and the protective layer 106 are formed up to a portion in contact with the back-surface bus bar electrode 108a. Therefore, the area of the passivation layer 104 increases on the back surface 101b of the semiconductor substrate 101. Thereby, the photoelectric conversion efficiency in the solar cell element 110 is improved.

By the way, for example, when the solar cell element 110 is used, expansion and contraction of each layer constituting the solar cell element 110 can occur by heating and cooling. At this time, for example, the thermal expansion coefficient may be remarkably different between the protective layer 106 and the back-surface collecting electrode 108b. In this case, the back-surface collecting electrode 108b may peel off from the protective layer 106 due to thermal expansion in response to heating and thermal contraction in response to cooling.

Therefore, the inventors of the present disclosure have created a technique capable of improving the adhesion of the back-surface collecting electrode to the semiconductor substrate with respect to the PERC type solar cell element.

Hereinafter, various embodiments will be described with reference to the drawings. In the drawings, the same reference numerals are given to portions having the same configuration and function, and redundant explanations are omitted in the following description. The drawings are shown schematically. In FIG. 1 to FIG. 8 and FIG. 12, a right-handed XYZ coordinate system is given. In this XYZ coordinate system, the width direction of the back-surface bus bar electrode 8a is the +X direction and the longitudinal direction of the back-surface bus bar electrode 8a is the +Y direction. In other words, in plan view of the back-surface bus bar electrode 8a, the first direction along the +X direction is the width direction of the back-surface bus bar electrode 8a and the second direction along the +Y direction is the longitudinal direction of the back-surface bus bar electrode 8a. In addition, in this XYZ coordinate system, the direction orthogonal to both the +X direction and the +Y direction is the +Z direction.

1. First Embodiment 1-1. Schematic Configuration of Solar Cell Element

A schematic configuration of a solar cell element 10 according to the first embodiment will be described with reference to FIG. 1 to FIG. 3. The solar cell element 10 according to the first embodiment is a PERC type solar cell element.

Figure 3:
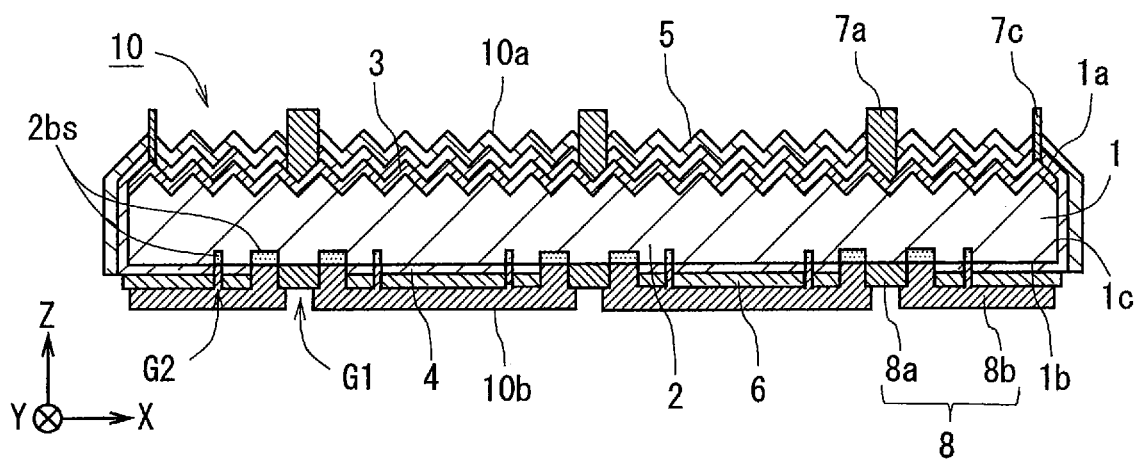
FIG. 3 illustrates a cross-sectional view showing an example of a cross section of the solar cell element taken along the line of FIG. 1 and FIG. 2.

As shown in FIG. 1 to FIG. 3, the solar cell element 10 has a first surface (also referred to as a first element surface) 10a located on the front surface side, which mainly receives light, and a second surface (also referred to as a second element surface) 10b located on the opposite side of the first element surface 10a. In the first embodiment, the first element surface 10a faces the +Z direction and the second element surface 10b faces the −Z direction.

The solar cell element 10 includes, for example, a semiconductor substrate 1, a passivation layer 4, an antireflection layer 5, a protective layer 6, a front-surface electrode 7, and a back-surface electrode 8.

The semiconductor substrate 1 has a first surface 1a and a second surface 1b opposite the first surface 1a. The first surface 1a is located on the first element surface 10a side of the solar cell element 10. In the first embodiment, the first surface 1a faces the +Z direction. The second surface 1b is located on the second element surface 10b side of the solar cell element 10. In the first embodiment, the second surface 1b faces the −Z direction. The first surface 1a and the second surface 1b each constitute the board surface of the semiconductor substrate 1 along the XY plane. The semiconductor substrate 1 has a thickness along the +Z direction.

Further, the semiconductor substrate 1 includes a first semiconductor layer 2 and a second semiconductor layer 3. The first semiconductor layer 2 is comprised of a semiconductor having a first conductivity type. The second semiconductor layer 3 is comprised of a semiconductor having a second conductivity type opposite to the first conductivity type. The first semiconductor layer 2 is located in a portion of the semiconductor substrate 1 on the second surface 1b side. The second semiconductor layer 3 is located in a surface layer portion of the semiconductor substrate 1 on the first surface 1a side. In the example of FIG. 3, the second semiconductor layer 3 is located on the first semiconductor layer 2.

Here, for example, it is assumed that the semiconductor substrate 1 is a silicon substrate. In this case, a polycrystalline or monocrystalline silicon substrate is adopted as the silicon substrate. The silicon substrate is, for example, a thin substrate having a thickness of 250 μm or less or 150 μm or less. Further, the silicon substrate has, for example, a substantially rectangular surface in plan view. When the semiconductor substrate 1 having such a shape is adopted, the gap between the solar cell elements 10 can be reduced when a solar cell module is manufactured by arranging the plurality of solar cell elements 10 side by side.

Further, for example, when the first conductivity type is p-type and the second conductivity type is n-type, the p-type silicon substrate can be produced by, for example, containing impurities such as boron or gallium as dopant elements in a polycrystalline or monocrystalline silicon crystal. In this case, the n-type second semiconductor layer 3 can be generated by diffusing impurities such as phosphorus as a dopant into a surface layer portion of the p-type silicon substrate on the first surface 1a side. At this time, the semiconductor substrate 1 in which the p-type first semiconductor layer 2 and the n-type second semiconductor layer 3 are stacked can be formed. As a result, the semiconductor substrate 1 includes a p-n junction portion located at an interface between the first semiconductor layer 2 and the second semiconductor layer 3.

As shown in FIG. 3, the first surface 1a of the semiconductor substrate 1 may have, for example, a fine rough structure (texture) for reducing the reflection of incoming light. In this case, the height of each protrusion of the texture ranges approximately from 0.1 μm to 10 μm, for example. The distance between apexes of the adjacent protrusions ranges approximately from 0.1 μm to 20 μm, for example. Depressions of the texture may each be approximately spherical, and protrusions of the texture may each be pyramidal, for example. The "height of each protrusion" in FIG. 3, for example, refers to a distance between the apex of the protrusion and a reference line that is defined as a straight line passing through the bottoms of depressions, in a direction perpendicular to the reference line (here, +Z direction).

Furthermore, the semiconductor substrate 1 includes a third semiconductor layer 2bs. The third semiconductor layer 2bs is located on a surface layer portion of the semiconductor substrate 1 on the second surface 1b side. The conductivity type of the third semiconductor layer 2bs may be the same as the conductivity type (p-type in the first embodiment) of the first semiconductor layer 2. Concentration of the dopant contained in the third semiconductor layer 2bs is higher than concentration of the dopant contained in the first semiconductor layer 2. The third semiconductor layer 2bs forms an internal electric field on the second surface 1b side of the semiconductor substrate 1. With this, in the vicinity of the second surface 1b of the semiconductor substrate 1, recombination of minority carriers generated by photoelectric conversion in response to irradiation of light in the semiconductor substrate 1 can be reduced. As a result, the photoelectric conversion efficiency is hardly lowered. The third semiconductor layer 2bs can be formed by diffusing dopant elements such as aluminum into a surface layer portion of the semiconductor substrate 1 on the second surface 1b side, for example. Here, concentration of the dopant elements in the first semiconductor layer 2 can be set to approximately from $5\times10^{15}$ atoms/cm$^3$ to $1\times10^{17}$ atoms/cm$^3$, and concentration of the dopant elements in the third semiconductor layer 2bs is set to approximately from $1\times10^{18}$ atoms/cm$^3$ to $5\times10^{21}$ atoms/cm$^3$. The third semiconductor layer 2bs may be present at a contact portion between a back-surface collecting electrode 8b described later and the semiconductor substrate 1.

The passivation layer 4 is located on at least the second surface 1b of the semiconductor substrate 1. In the first embodiment, the passivation layer 4 is in contact with the second surface 1b of the semiconductor substrate 1. The passivation layer 4 can reduce recombination of minority carriers generated by photoelectric conversion in response to irradiation of light in the semiconductor substrate 1. As a material of the passivation layer 4, for example, one or more kinds of material selected from an aluminum oxide, a zirconium oxide, a hafnium oxide, a silicon oxide, a silicon nitride, a silicon oxynitride, and the like may be adopted. In this case, the passivation layer 4 can be formed by, for example, atomic layer deposition (ALD). Here, the aluminum oxide has a negative fixed charge. For this reason, minority carriers (electrons in this case) generated on the second surface 1b side of the semiconductor substrate 1 are brought away from an interface between the p-type first semiconductor layer 2 and the passivation layer 4 (second surface 1b) due to an electric field effect. With this, recombination of minority carriers in the vicinity of the second surface 1b of the semiconductor substrate 1 can be reduced. As a result, photoelectric conversion efficiency of the solar cell element 10 can be improved. The passivation layer 4 has a thickness of, for example, approximately from 10 nm to 200 nm. The passivation layer 4 may also be located on the first surface 1a of the semiconductor substrate 1, for example. The passivation layer 4 may be located on an end face 1c connecting the first surface 1a and the second surface 1b of the semiconductor substrate 1, for example.

Further, for example, when aluminum oxide used for the passivation layer 4 is expressed by $Al_2O_x$, X is not limited to 3 or more. X may be less than 3, for example approximately 2.6 to 2.9. In this case, aluminum becomes less likely to be lost in the molecular structure of the aluminum oxide film constituting the passivation layer 4. As a result, the aluminum oxide film becomes denser. As a result, in the solar cell element 10, due to presence of the passivation layer 4, electric leakage hardly occurs and moisture resistance can be improved. Therefore, the long-term reliability of the solar cell element 10 can be further improved.

The antireflection layer 5 can reduce the reflectance of incoming light to the first element surface 10a of the solar cell element 10. As a material of the antireflection layer 5, for example, a silicon oxide, aluminum oxide, silicon nitride, or the like can be adopted. The refractive index and the thickness of the antireflection layer 5 may be appropriately set to values that allow light out of sunlight within such a wavelength range that is absorbed into the semiconductor substrate 1 and can thus contribute to power generation to satisfy conditions of low reflectance (also referred to as low reflection conditions). The antireflection layer 5 has a refractive index of approximately from 1.8 to 2.5, for example. The antireflection layer 5 has a thickness of approximately from 20 nm to 120 nm, for example.

The protective layer 6 is located on the passivation layer 4 located on the second surface 1b of the semiconductor substrate 1. In the first embodiment, the protective layer 6 covers the passivation layer 4 on the passivation layer 4. Thereby, the passivation layer 4 can be protected. As the material of the protective layer 6, for example, one or more kinds selected from a silicon oxide, a silicon nitride, a silicon oxynitride, and the like are adopted. The protective layer 6 is located in a state of having a desired pattern on the passivation layer 4. The protective layer 6 includes a gap portion penetrating the protective layer 6 in the thickness direction (here, the +Z direction). This gap portion may be, for example, a hole portion forming a through hole in which the periphery along the second surface 1b is closed or may be a slit-like hole portion in which at least a part of the periphery along the second surface 1b is opened. Here, it is assumed that the protective layer 6 includes the plurality of gap portions in plan view of the protective layer 6. The plurality of gap portions include, for example, a first gap portion G1 and a second gap portion G2 different from the first gap portion G1.

Both the later-described back-surface bus bar electrode 8a and the back-surface collecting electrode 8b are located in the first gap portion G1. In plan view of the protective layer 6, for example, each of the first gap portions G1 has such a shape as to extend in the width direction of the back-surface bus bar electrode 8a from the position of the back-surface bus bar electrode 8a.

In the second gap portion G2, the back-surface collecting electrode 8b is located without the back-surface bus bar electrode 8a being located. Each of the second gap portions G2 may have a dot (point)-like shape, or may have a band-like (linear) shape. The diameter or width of the second gap portion G2 is, for example, approximately from 10 μm to 500 μm. The pitch of the second gap portion G2 is, for example, approximately from 0.3 mm to 3 mm. The pitch of the second gap portion G2 is, for example, the distance between the centers of the second gap portions G2 adjacent to each other in plan view of the protective layer 6.

Meanwhile, when forming the back-surface collecting electrode 8b described later on the protective layer 6, for example, a metal paste including metal powder containing aluminum as a main component, organic vehicle, and glass frit (also referred to as an Al paste) is applied so as to have a desired shape, and then fired. Here, in the present description, the main component means a component having the largest (higher) content (also referred to as content ratio) contained in the contained components. At this time, the Al paste applied directly onto the passivation layer 4 in the first gap portion G1 and the second gap portion G2 of the protective layer 6 causes fire through (also referred to as firing penetration) of the passivation layer 4. Thus, the back-surface collecting electrode 8b is connected directly to the second surface 1b of the semiconductor substrate 1. As a result, each of the first gap portion G1 and the second gap portion G2 penetrates not only the protective layer 6 but also the passivation layer 4. At this time, for example, aluminum in the Al paste diffuses into the surface layer portion of the semiconductor substrate 1 on the second surface 1b side, whereby the third semiconductor layer 2bs is formed.

Further, for example, the thickness of the protective layer 6 is sufficiently larger than the thickness of the passivation layer 4. Therefore, in the portion covered with the protective layer 6 of the passivation layer 4, the Al paste does not cause firing penetration of the passivation layer 4. With this, in the solar cell element 10, the passivation layer 4 can be present in a pattern corresponding to a desired pattern of the protective layer 6 on the second surface 1b of the semiconductor substrate 1. The thickness of the protective layer 6 is, for example, approximately from 0.5 µm to 10 µm. The thickness of the protective layer 6 is changed appropriately depending on, for example, the composition of an insulation paste for forming the protective layer 6, the shape of the second surface 1b of the semiconductor substrate 1, the firing conditions at the time of forming the back-surface collecting electrode 8b, and the like.

The protective layer 6 is formed, for example, on the passivation layer 4 formed on the second surface 1b of the semiconductor substrate 1 by a wet process or a dry process. As a wet process, for example, a process using application of an insulation paste or the like is applied. In this case, for example, the protective layer 6 is formed by applying an insulation paste on the passivation layer 4 so as to have a desired pattern by an application method such as a screen printing method, and then drying it. The insulation paste is an insulation paste containing, for example, a siloxane resin as a raw material of the protective layer 6, an organic solvent, and a plurality of fillers. The siloxane resin is a siloxane compound having a siloxane bond (Si—O—Si bond). Specifically, the siloxane resin may be, for example, a low molecular weight resin having a molecular weight of 10,000 or less generated by hydrolyzing and condensation polymerizing alkoxysilane, silazane, or the like. As a dry process, a process using, for example, plasma-enhanced chemical vapor deposition (PECVD), sputtering, or the like is applied.

On the end face 1c of the semiconductor substrate 1 for example, the protective layer 6 may be formed directly or also on the antireflection layer 5 formed on the passivation layer 4. In this case, leakage current in the solar cell element 10 can be reduced owing to the presence of the protective layer 6.

The front-surface electrode 7 is located on the first surface 1a side of the semiconductor substrate 1. As shown in FIG. 1 and FIG. 3, the front-surface electrode 7 includes a front-surface bus bar electrode 7a and a plurality of front-surface collecting electrodes 7b.

The front-surface bus bar electrode 7a is a bus bar electrode for extracting electricity obtained by the photoelectric conversion in response to the irradiation of light in the semiconductor substrate 1 to the outside of the solar cell element 10. The front-surface bus bar electrode 7a may be, for example, a bus bar electrode having an elongated rectangular shape in plan view. The length in the short direction of the front-surface bus bar electrode 7a (also referred to as the width) is, for example, approximately from 1.3 mm to 2.5 mm. At least a part of the front-surface bus bar electrode 7a is in a state of crossing and being electrically connected with the front-surface collecting electrode 7b.

The front-surface collecting electrode 7b can collect electricity obtained by photoelectric conversion in response to the irradiation of light in the semiconductor substrate 1. Each of the front-surface collecting electrodes 7b is, for example, a linear electrode having a width of approximately from 50 µm to 200 µm. In other words, the width of each of the front-surface collecting electrodes 7b is smaller than the width of the front-surface bus bar electrode 7a. The plurality of front-surface collecting electrodes 7b are located at intervals of approximately from 1 mm to 3 mm to each other, for example.

The thickness of the front-surface electrode 7 is, for example, approximately from 10 µm to 40 µm. The front-surface electrode 7 can be formed, for example, by applying a metal paste containing a metal powder including silver as a main component, an organic vehicle, and a glass frit (also referred to as a silver paste) in a desired shape by screen printing or the like and then firing this silver paste. Further, for example, an auxiliary electrode 7c having the same shape as that of the front-surface collecting electrode 7b may be positioned along the peripheral edge portion of the semiconductor substrate 1 so that the front-surface collecting electrodes 7b are electrically connected to each other.

The back-surface electrode 8 is located on the second surface 1b side of the semiconductor substrate 1. As shown in FIG. 2 and FIG. 3, the back-surface electrode 8 includes the back-surface bus bar electrode 8a and the back-surface collecting electrode 8b.

The back-surface bus bar electrode 8a is located on the second surface 1b side of the semiconductor substrate 1. The back-surface bus bar electrode 8a is a bus bar electrode for extracting electricity obtained by photoelectric conversion in the solar cell element 10 to the outside of the solar cell element 10. For example, in the case of manufacturing a solar cell module by electrically connecting the plurality of solar cell elements 10 in series, the back-surface bus bar electrode 8a and the front-surface bus bar electrode 7a are connected by a wiring material between the adjacent solar cell elements 10. Here, the wiring material is joined to, for example, the back-surface bus bar electrode 8a and the front-surface bus bar electrode 7a by soldering or the like.

In the example of FIG. 2, three back-surface bus bar electrodes 8a are present on the second surface 1b side of the semiconductor substrate 1. Each of the back-surface bus bar electrodes 8a includes N (N is an integer of 2 or more) electrode portions having an island shape (also referred to as island-shaped electrode portions) 8ai aligned along the +Y direction as the longitudinal direction of the back-surface bus bar electrode 8a along the second surface 1b. Here, the second direction in which the N island-shaped electrode portions 8ai are aligned is the longitudinal direction of the back-surface bus bar electrode 8a. Here, the number of N is six. In other words, three rows of the island-shaped electrode portions 8ai each aligned along the longitudinal direction (here, the +Y direction) of the back-surface bus bar electrode 8a are present on the second surface 1b side of the semiconductor substrate 1. The back-surface bus bar electrode 8a has a width direction crossing the longitudinal direction. Here, the width direction is the +X direction. The thickness of the back-surface bus bar electrode 8a is, for example, approximately from 10 µm to 30 µm. The width of the back-surface bus bar electrode 8a is, for example, approximately from 1.3 mm to 7 mm. When the back-surface bus bar electrode 8a contains silver as a main component, the back-surface bus bar electrode 8a can be formed by, for example, applying a silver paste in a desired shape by screen printing or the like and then firing this silver paste. The silver paste contains metal powder including silver as a main component, an organic vehicle, and a glass frit. At this time, for example, the silver paste applied directly on the passivation layer 4 in the first gap portion G1 of the protective layer 6 causes firing penetration of the passivation layer 4.

As a result, the back-surface bus bar electrode 8a is directly connected to the second surface 1b of the semiconductor substrate 1.

The back-surface collecting electrode 8b is located on the protective layer 6 on the second surface 1b side of the semiconductor substrate 1. In addition, the back-surface collecting electrode 8b is located in the first gap portion G1 and the second gap portion G2 penetrating the protective layer 6 and the passivation layer 4, and is in a state of being electrically connected to the semiconductor substrate 1. In the example of FIG. 2, 18 first gap portions G1 and 64 second gap portions G2 are present. However, for each of the first gap portions G1 and each of the second gap portions G2, the combination of size, shape, and number can be appropriately adjusted. Therefore, the number of each of the first gap portions G1 and the second gap portions G2 may be at least one, for example.

The back-surface collecting electrode 8b can collect electricity obtained by photoelectric conversion in response to the irradiation of light in the semiconductor substrate 1 on the second surface 1b side of the semiconductor substrate 1. The back-surface collecting electrode 8b is located in a state of being electrically connected to at least a part of the back-surface bus bar electrode 8a. The thickness of the back-surface collecting electrode 8b is, for example, approximately from 15 µm to 50 µm. In the case where the back-surface collecting electrode 8b contains aluminum as a main component, the back-surface collecting electrode 8b can be formed by firing the Al paste after the Al paste is applied in a desired shape, for example.

Furthermore, the back-surface collecting electrode 8b may have a shape like the front-surface collecting electrode 7b on the second surface 1b of the solar cell element 10, for example, and may also be connected with the back-surface bus bar electrode 8a. If such a structure is adopted, incoming light onto the second element surface 10b of the solar cell element 10 can also be used for photoelectric conversion in the solar cell element 10. With this, for example, the output of the solar cell element 10 can be improved. Incoming light onto the second element surface 10b may be generated, for example, by reflection of sunlight from the ground or the like.

1-2. Configuration in Vicinity of First Gap Portion and Second Gap Portion of Solar Cell Element The configuration of the solar cell element 10 according to the first embodiment in the vicinity of the first gap portion G1 and the second gap portion G2 will be described with reference to FIG. 4 to FIG. 8. Here, the planar shape of the first gap portion G1 and the second gap portion G2 penetrating the protective layer 6 can be observed with, for example, an optical microscope or a scanning electron microscope (SEM) after the back-surface electrode 8 of the solar cell element 10 is removed by etching using hydrochloric acid or the like. The cross section of the solar cell element 10 can be observed by SEM or the like after a portion having distortion and scratches due to cutting is removed by etching using hydrochloric acid or the like after cutting of the solar cell element 10, for example.

Figure 4:
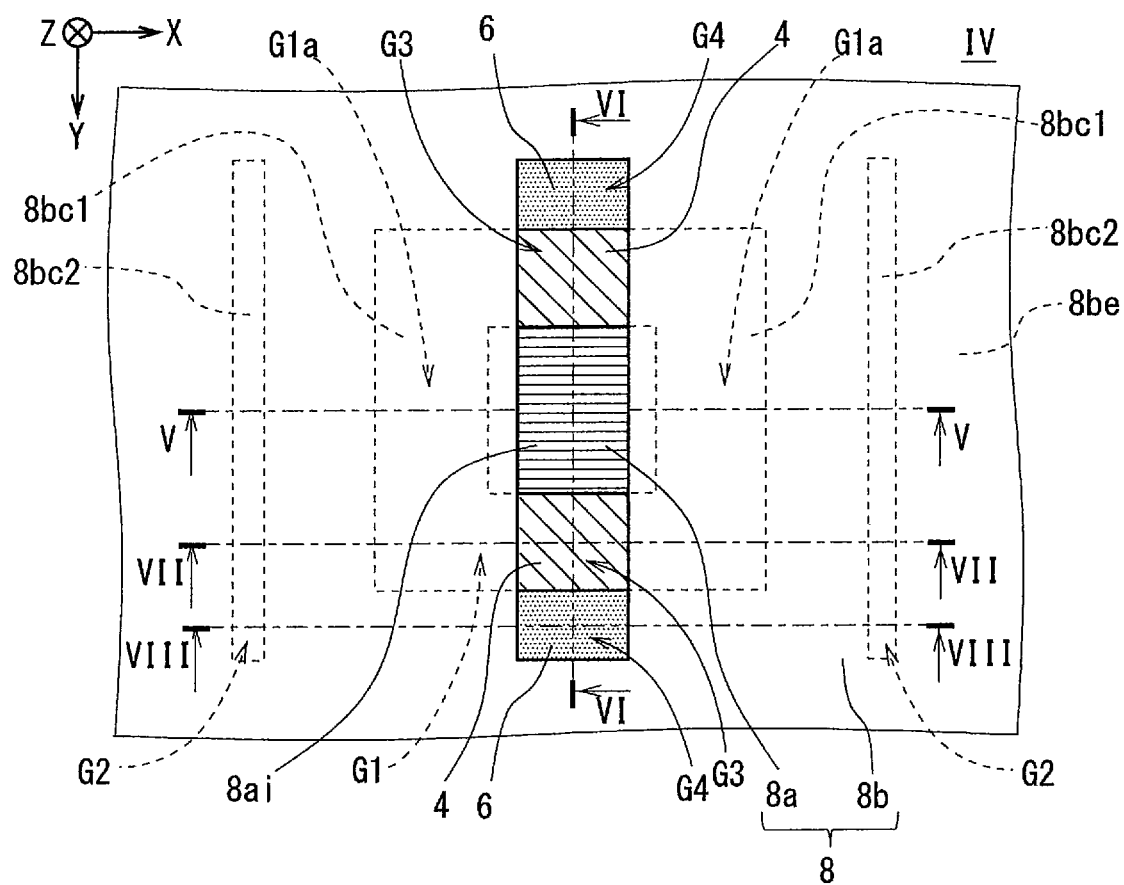
FIG. 4 illustrates an enlarged plan view showing an appearance of an example of the region IV in FIG. 2.
Figure 5:
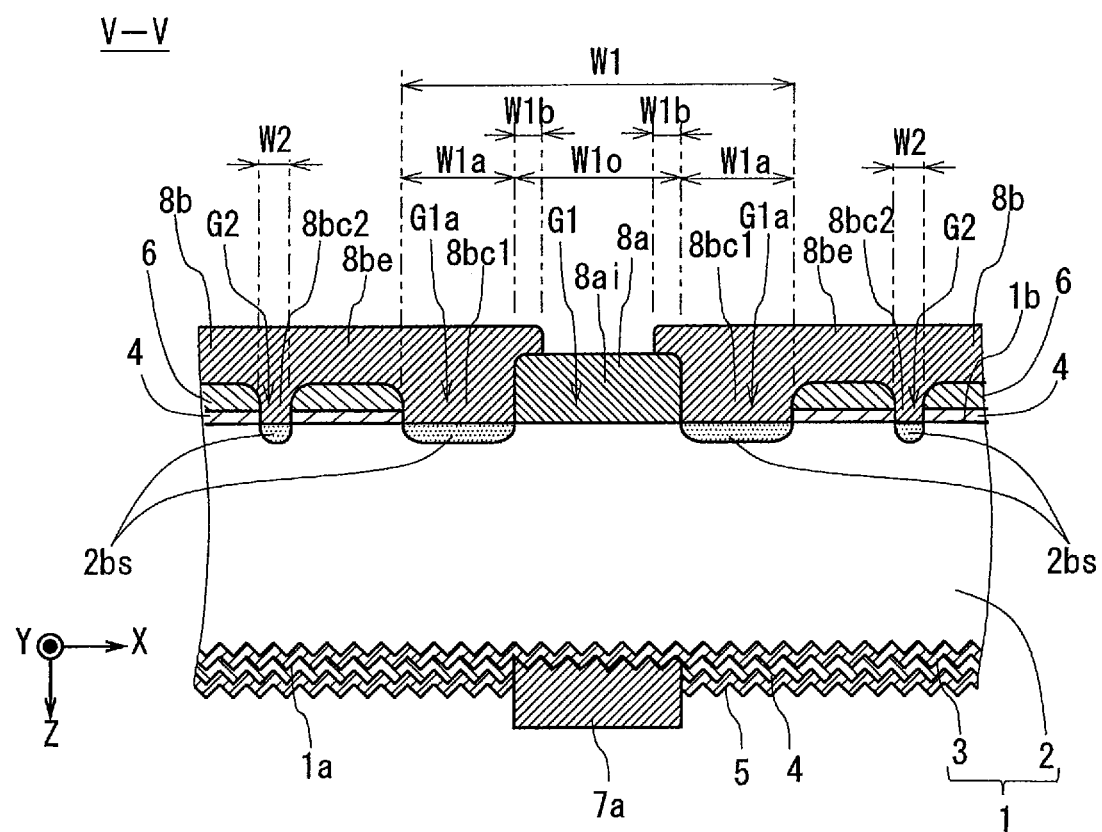
FIG. 5 illustrates a cross-sectional view showing an example of a cross section of the solar cell element taken along the line V-V of FIG. 4.
Figure 6:
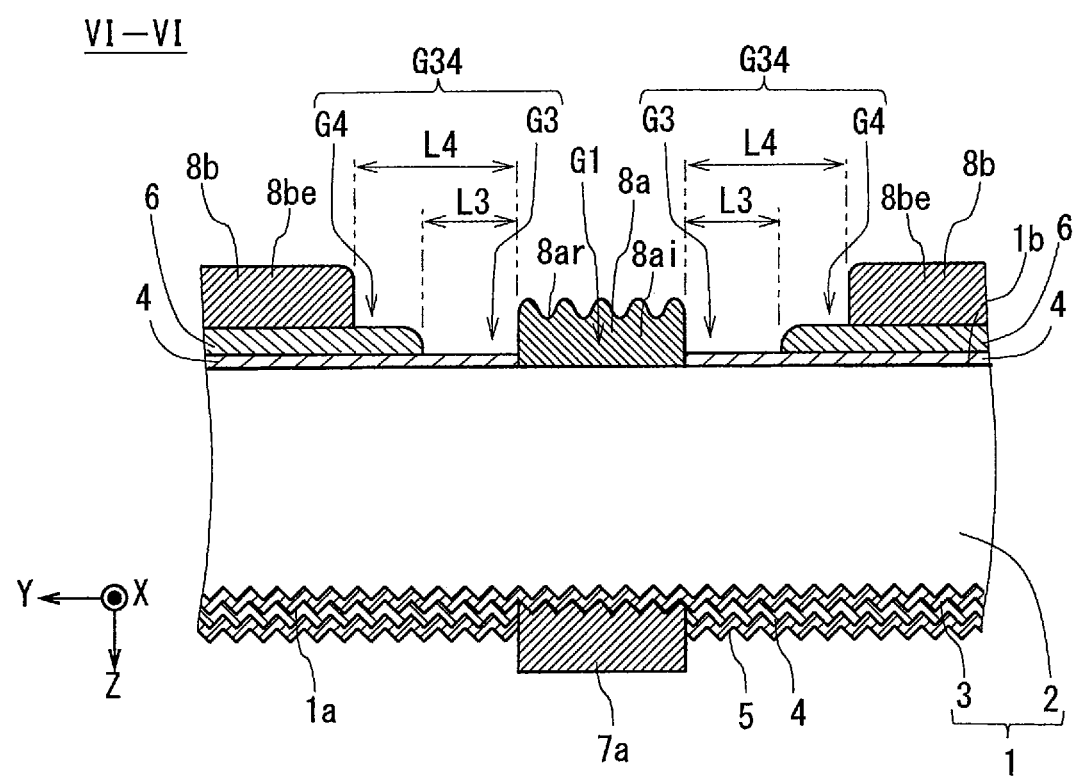
FIG. 6 illustrates a cross-sectional view showing an example of a cross section of the solar cell element taken along the line VI-VI of FIG. 4.

As shown in FIG. 4, FIG. 5, and FIG. 6, the back-surface bus bar electrode 8a is in contact with the second surface 1b of the semiconductor substrate 1 in the first gap portion G1 penetrating the passivation layer 4 and the protective layer 6. As shown in FIG. 4 and FIG. 5, the back-surface bus bar electrode 8a is located in a state of sandwiching a gap region G1a with the passivation layer 4 and the protective layer 6 in the width direction (here, the +X direction) of the back-surface bus bar electrode 8a. In other words, the gap region G1a is a region between the back-surface bus bar electrode 8a and both of the passivation layer 4 and the protective layer 6.

In the examples of FIG. 4 and FIG. 5, the gap regions G1a are respectively present on both sides of the back-surface bus bar electrode 8a in the width direction of the back-surface bus bar electrode 8a. Specifically, for example, the gap region G1a is present on the +X direction side of the back-surface bus bar electrode 8a, and the gap region G1a is present on the -X direction side of the back-surface bus bar electrode 8a. More specifically, for example, as shown in FIG. 5, in the first gap portion G1 having a width W1 along the +X direction, there is the back-surface bus bar electrode 8a having a width W1o in the center portion in the +X direction. In the first gap portion G1, there is the gap region G1a having a width W1a on the +X direction side of the back-surface bus bar electrode 8a, and there is a gap region G1a having the width W1a on the -X direction side of the back-surface bus bar electrode 8a. The width W1a of the gap regions G1a respectively present on both sides of the back-surface bus bar electrode 8a in the width direction of the back-surface bus bar electrode 8a may be identical to each other or may be different from each other.

As shown in FIG. 4 to FIG. 8, the back-surface collecting electrode 8b includes an electrode layer portion 8be, a first connecting portion 8bc1, and a second connecting portion 8bc2. The electrode layer portion 8be is located on the protective layer 6.

The first connecting portion 8bc1 is located in the gap region G1a and includes a portion connecting the electrode layer portion 8be and the second surface 1b. Thus, for example, in the first gap G1, if the back-surface collecting electrode 8b is connected with the semiconductor substrate 1, the back-surface collecting electrode 8b can be connected with the second surface 1b in the vicinity of the edge portion on the back-surface bus bar electrode 8a side of the back-surface collecting electrode 8b. In this case, for example, when the first connecting portion 8bc1 of the back-surface collecting electrode 8b is formed by firing the Al paste, the third semiconductor layer 2bs is formed at the interface between the first connecting portion 8bc1 and the second surface 1b. Specifically, at this interface portion, an alloy of a component (for example, silicon) of the semiconductor substrate 1 and a component (for example, aluminum) of the back-surface collecting electrode 8b is formed. Thereby, the adhesion of the back-surface collecting electrode 8b with respect to the semiconductor substrate 1 can be improved as compared with the electrode layer portion 8be located on the protective layer 6. As a result, peeling of the back-surface collecting electrode 8b is made less liable to occur, for example, in the vicinity portion (here, the first gap G1) of the connecting portion between the back-surface bus bar electrode 8a and the back-surface collecting electrode 8b, where the current density of a photocurrent generated by the photoelectric conversion increases. Accordingly, the reliability of the PERC type solar cell element 10 can be improved.

Further, the first connecting portion 8bc1 is present in a state of extending in the +Z direction from the electrode layer portion 8be to the second surface 1b in the gap region G1a. In this case, for example, the thickness of the first connecting portion 8bc1 is the sum of the thickness of the electrode layer portion 8be and the thickness of the portion within the gap region G1a. In other words, the thickness of the first connecting portion 8bc1 is larger than the thickness of the electrode layer portion 8*be*. Here, for example, it is assumed that a solar cell module is manufactured by electrically connecting the plurality of solar cell elements 10 in series. In this case, the back-surface bus bar electrode 8*a* and the front-surface bus bar electrode 7*a* are electrically connected in series by the wiring material between the adjacent solar cell elements 10. In this case, for example, the thickness of the back-surface collecting electrode 8*b* can be increased along the direction of the flow of a photocurrent when the photocurrent generated by photoelectric conversion in response to the irradiation of light in the semiconductor substrate 1 flows toward the back-surface bus bar electrode 8*a* by the back-surface collecting electrode 8*b*. As a result, the electric resistance component related to the series connection in each of the solar cell elements 10 can be reduced.

In addition, for example, if the protective layer 6 is formed by applying an insulation paste, it is assumed that the thickness of the vicinity of the end portion in contact with the first gap portion G1 of the protective layer 6 gradually decreases toward the edge portion of the protective layer 6. In this case, for example, when a photocurrent generated by the photoelectric conversion in response to the irradiation of light in the semiconductor substrate 1 flows toward the back-surface bus bar electrode 8*a* by the back-surface collecting electrode 8*b*, the thickness of the back-surface collecting electrode 8*b* gradually increases along the direction in which the photocurrent flows. As a result, for example, the component of the electrical resistance related to the series connection in each of the solar cell elements 10 can be reduced.

The second connecting portion 8*bc*2 is located in the second gap portion G2 and connects the electrode layer portion 8*be* and the second surface 1*b*. Here, the second connecting portion 8*bc*2 is a portion that is present in a state of extending in the +Z direction from the electrode layer portion 8*be* to the second surface 1*b* in the second gap portion G2.

In the example of FIG. 5, the first connecting portion 8*bc*1 having the width W1*a* along the +X direction is present in the gap region G1*a* having the width W1*a* along the +X direction. The back-surface collecting electrode 8*b* is superimposed on the back-surface bus bar electrode 8*a* in a portion having a width W1*b* along the +X direction, for example. In other words, a part of the back-surface collecting electrode 8*b* is located on a part of the back-surface bus bar electrode 8*a*. In the second gap portion G2 having a width W2 in the +X direction, the second connecting portion 8*bc*2 having the width W2 in the +X direction is present. Here, for example, if the width W1*a* of the gap region G1*a* is larger than the width W2 of the second gap portion G2, adhesion of the back-surface collecting electrode 8*b* with respect to the semiconductor substrate 1 can be improved due to the connection to the semiconductor substrate 1 via the gap region G1*a* of the back-surface collecting electrode 8*b*.

Figure 7:
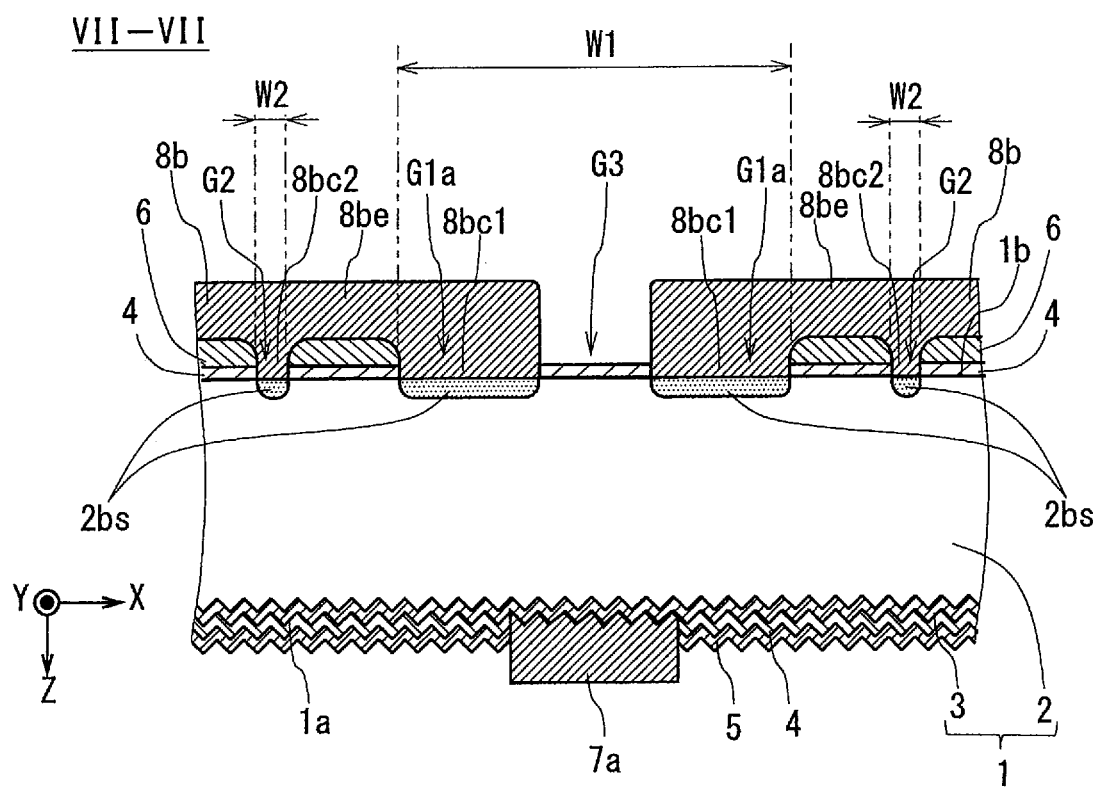
FIG. 7 illustrates a cross-sectional view showing an example of a cross section of the solar cell element taken along the line VII-VII of FIG. 4.

As shown in FIG. 4, FIG. 6, and FIG. 7, the protective layer 6 is located in a state of sandwiching a third gap portion G3 with the island-shaped electrode portion 8*ai* in the longitudinal direction (here, the +Y direction) of the back-surface bus bar electrode 8*a*. The third gap portion G3 is a gap region as a space region in the layer where the protective layer 6 is present. In the first embodiment, for example, the third gap portions G3 are respectively present on both sides of the back-surface bus bar electrode 8*a* in the longitudinal direction (+Y direction) of the back-surface bus bar electrode 8*a*. Specifically, for example, the third gap portion G3 is present on the +Y direction side of the back-surface bus bar electrode 8*a*, and the third gap portion G3 is present on the −Y direction side of the back-surface bus bar electrode 8*a*. As shown in FIG. 6, each of the third gap portions G3 has a length L3 along the +Y direction. The length L3 of the third gap portions G3 respectively present on both sides of the back-surface bus bar electrode 8*a* in the longitudinal direction of the back-surface bus bar electrode 8*a* may be identical to each other or may be different from each other.

Figure 8:
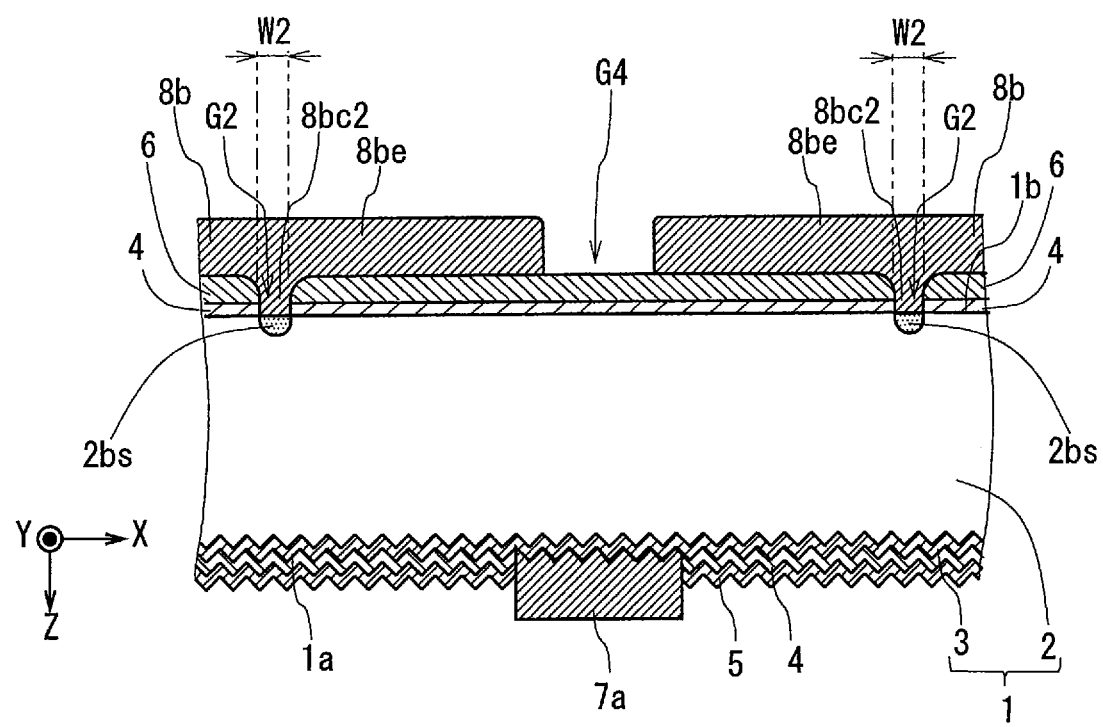
FIG. 8 illustrates a cross-sectional view showing an example of a cross section of the solar cell element taken along the line VIII-VIII of FIG. 4.

As shown in FIG. 4, FIG. 6, and FIG. 8, the back-surface collecting electrode 8*b* is located in a state of sandwiching a fourth gap portion G4 with the island-shaped electrode portion 8*ai* in the longitudinal direction of the back-surface bus bar electrode 8*a*. The fourth gap portion G4 is a gap region as a space region in the layer where the back-surface collecting electrode 8*b* is present. In the first embodiment, for example, the fourth gap portions G4 are respectively present on both sides of the back-surface bus bar electrode 8*a* in the longitudinal direction (+Y direction) of the back-surface bus bar electrode 8*a*. Specifically, for example, the fourth gap portion G4 is present on the +Y direction side of the back-surface bus bar electrode 8*a*, and the fourth gap portion G4 is present on the −Y direction side of the back-surface bus bar electrode 8*a*. As shown in FIG. 6, each of the fourth gap portions G4 has a length L4 along the +Y direction. The length L4 of the fourth gap portions G4 respectively present on both sides of the back-surface bus bar electrode 8*a* in the longitudinal direction of the back-surface bus bar electrode 8*a* may be identical to each other or may be different from each other.

Here, as shown in FIG. 4 and FIG. 6, the third gap portion G3 and the fourth gap portion G4 are superimposed with each other in perspective plan view of the back-surface collecting electrode 8*b* and the protective layer 6. In the examples of FIG. 4 and FIG. 6, the fourth gap portion G4 is superimposed to the third gap portion G3 so as to cover the entire area of the third gap portion G3 in perspective plan view of the back-surface collecting electrode 8*b* and the protective layer 6. Accordingly, the third gap portion G3 and the fourth gap portion G4 constitute a gap portion (also referred to as a stepped gap portion) G34 having one step portion. In the first embodiment, for example, the stepped gap portions G34 are respectively present on both sides of the back-surface bus bar electrode 8*a* in the longitudinal direction (+Y direction) of the back-surface bus bar electrode 8*a*. Specifically, for example, the stepped gap portion G34 is present on the +Y direction side of the back-surface bus bar electrode 8*a*, and the stepped gap portion G34 is present on the −Y direction side of the back-surface bus bar electrode 8*a*.

In perspective plan view of the passivation layer 4, the passivation layer 4 is present in a state of extending to a position where the third gap portion G3 and the fourth gap portion G4 are superimposed with each other. In other words, in the example of FIG. 6, the passivation layer 4 is exposed with respect to the third gap portion G3. If such a structure is adopted, for example, in the longitudinal direction (+Y direction) of the back-surface bus bar electrode 8*a*, for example, the portion where the protective layer 6 and the back-surface bus bar electrode 8*a* are in contact with each other decreases.

Here, for example, it is assumed that a solar cell module is manufactured by electrically connecting the plurality of solar cell elements 10 in series. In this case, the back-surface bus bar electrode 8*a* and the front-surface bus bar electrode 7*a* are electrically connected in series by the wiring material between the adjacent solar cell elements 10. At this time, if the back-surface bus bar electrode 8a and the protective layer 6 are in contact with each other, for example, when a wiring material is jointed to the back-surface bus bar electrode 8a, the protective layer 6 is prone to deteriorate in response to heat applied to the wiring material. In addition, for example, the protective layer 6 tends to peel off and fall off from the surface of the back-surface bus bar electrode 8a in response to the difference in thermal expansion coefficient between the back-surface bus bar electrode 8a and the protective layer 6.

On the other hand, in the first embodiment, the portion where the protective layer 6 and the back-surface bus bar electrode 8a are in contact with each other has decreased in the longitudinal direction (+Y direction) of the back-surface bus bar electrode 8a, for example. With this, when the wiring material is joined to the back-surface bus bar electrode 8a, for example, deterioration of the protective layer 6 in response to the heat applied to the wiring material is less likely to occur. In addition, for example, the protective layer 6 is made less likely to peel off and fall off from the back-surface bus bar electrode 8a in response to the difference in thermal expansion coefficient between the back-surface bus bar electrode 8a and the protective layer 6. Further, for example, since the chemical reaction between the back-surface bus bar electrode 8a and the protective layer 6 becomes less like to occur, characteristics and reliability of the output of the back-surface bus bar electrode 8a become less like to deteriorate.

In addition, since the passivation layer 4 is present in a state of extending to a position where the third gap portion G3 and the fourth gap portion G4 are superimposed with each other, for example, the exposure of the second surface 1b of the semiconductor substrate 1 with respect to the third gap portion G3 can be reduced. Thereby, for example, even if heat is applied to the wiring material when the wiring material is joined to the back-surface bus bar electrode 8a, the oxide film becomes less likely to grow on the second surface 1b of the semiconductor substrate 1. For this reason, the passivation layer 4 can become less likely to peel off. As a result, the reliability of the solar cell element 10 can be improved. Here, for example, if the passivation layer 4 is present in a state of extending to a position where it comes into contact with the back-surface bus bar electrode 8a, the exposure of the second surface 1b of the semiconductor substrate 1 with respect to the third gap portion G3 can be reduced.

In addition, here, the length L4 where the back-surface bus bar electrode 8a and the back-surface collecting electrode 8b are separated is larger than the length L3 in the longitudinal direction (+Y direction) of the back-surface bus bar electrode 8a. Thereby, for example, when the wiring material is joined to the back-surface bus bar electrode 8a, a raise of the wiring material due to the presence of the back-surface collecting electrode 8b can be reduced. Here, the raise of the wiring material can be caused, by a force generated to the wiring material in a direction away from the island-shaped electrode portion 8ai (here, the −Z direction) due to the contact with the electrode layer portion 8be located on both sides of the island-shaped electrode portion 8ai in the longitudinal direction (+Y direction) of the back-surface bus bar electrode 8a, for example. This force can be generated by elastic force or the like of the wiring material by elastically deforming the wiring material so as to be joined to the island-shaped electrode portion 8ai in a case where the island-shaped electrode portion 8ai is recessed rather than the electrode layer portion 8be, for example.

Here, for example, if such a raise of the wiring material is reduced, a problem of being less likely to join the wiring material to the back-surface bus bar electrode 8a hardly occurs.

Further, as shown in FIG. 6, it becomes possible to partially thicken the thickness of a joining agent such as solder in a concave portion if the back-surface bus bar electrode 8a has a concavo-convex structure on a surface (also referred to as a joined surface) 8ar on the side opposite to the second surface 1b. As a result, the wiring material can be firmly joined to the joined surface 8ar of the back-surface bus bar electrode 8a. Such a concavo-convex structure can be formed by adjusting the shapes of the mesh, the mask, and the like when the silver paste is applied in a desired shape by screen printing or the like, for example. The depth of the concave portion on the joined surface 8ar of the back-surface bus bar electrode 8a may be, for example, approximately from ¼ to ½ of the thickness of the thickest portion of the back-surface bus bar electrode 8a, and further the concavo portion may partially penetrate the back-surface bus bar electrode 8a and reach the second surface 1b.

1-3. Manufacture of Solar Cell Element

An example of a method for manufacturing the solar cell element 10 will be described with reference to FIG. 9, FIG. 10, and FIG. 11A to FIG. 11F. Here, it is possible to manufacture the solar cell element 10 by performing the process of a step ST1 to a step ST4 shown in FIG. 9 in this order.

1-3-1. Preparation of Semiconductor Substrate

In step ST1, a process of preparing the semiconductor substrate 1 (also referred to as a first process) is performed. The semiconductor substrate 1 has a first surface 1a and a second surface 1b opposite the first surface 1a.

Figure 11A:
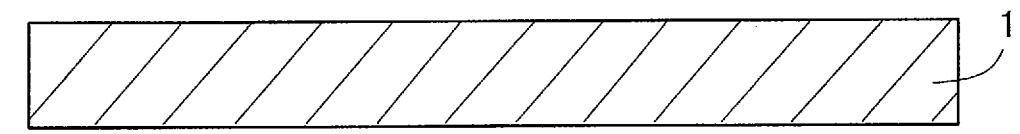
FIG. 11A to FIG. 11E each illustrates a cross-sectional view showing an example of a cross section corresponding to the cross section of FIG. 3 in the middle of manufacturing a solar cell element.

Here, first, the semiconductor substrate 1 is prepared as shown in FIG. 11A. The semiconductor substrate 1 can be formed using, for example, an existing CZ method, a casting method, or the like. Here, an example using an ingot of a p-type polycrystalline silicon prepared by casting will be described. The ingot is cut into slices each having a thickness of 250 μm or less, for example, to prepare the semiconductor substrate 1. Here, for example, when a very small amount of etching is performed with an aqueous solution of sodium hydroxide, potassium hydroxide, a mixed solution of hydrofluoric acid and nitric acid, or the like on the surface of the semiconductor substrate 1, a mechanically-damaged layer and a contaminated layer of the cut surface of the silicon substrate 1 can be removed.

Figure 11B:
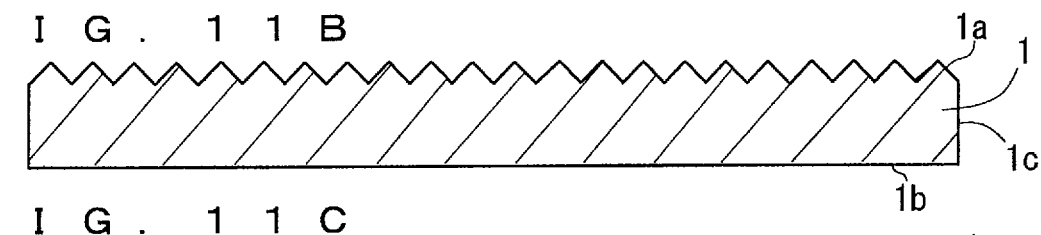

Next, a texture is formed on the first surface 1a side of the silicon substrate 1 as shown in FIG. 11B. The texture can be formed by wet etching using an alkaline aqueous solution such as sodium hydroxide or an acidic aqueous solution such as hydrofluoric-nitric acid, or by dry etching such as reactive ion etching (RIE).

Figure 11C:
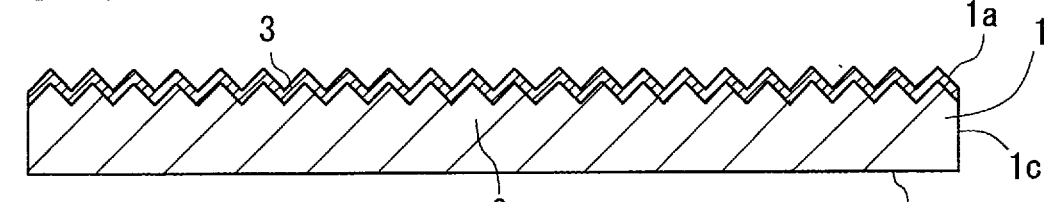

Next, as shown in FIG. 11C, the second semiconductor layer 3 as an n-type semiconductor region is formed on the first surface 1a side of the semiconductor substrate 1 having the texture. Specifically, the n-type second semiconductor layer 3 is formed in the surface layer portion of the semiconductor substrate 1 having the texture on the first surface 1a side. The second semiconductor layer 3 can be formed by application thermal diffusion in which a diphosphoruspentaoxide ($P_2O_5$) paste is applied onto the surface of the semiconductor substrate 1 and phosphorus is thermally diffused, or by gas phase thermal diffusion using a phosphorus oxychloride ($POCl_3$) gas as the source of diffusion, for example. The second semiconductor layer 3 is formed to have a depth of approximately from 0.1 μm to 2 μm and a sheet resistance of approximately from 40 Ω/□ to 200 Ω/□.

In the gas phase thermal diffusion, first, the semiconductor substrate 1 is heat treated in an atmosphere of a diffusion gas containing mainly $POCl_3$ and the like at a temperature of approximately from 600° C. to 800° C. for approximately from 5 minutes to 30 minutes to form phosphorus glass on the surface of the semiconductor substrate 1, for example. The semiconductor substrate 1 is then heat treated in an atmosphere of an inert gas such as argon or nitrogen at a relatively high temperature of approximately from 800° C. to 900° C. for approximately from 10 minutes to 40 minutes. Phosphorus is thereby diffused from the phosphorus glass into the semiconductor substrate 1 to form the second semiconductor layer 3 in the surface layer of the semiconductor substrate 1 on the first surface 1a side.

Here, when the second semiconductor layer 3 is formed, the second semiconductor layer may be formed also on the second surface 1b side of the semiconductor substrate 1 in some cases. In this case, the second semiconductor layer formed on the second surface 1b side of the semiconductor substrate 1 is removed by etching. For example, the second semiconductor layer formed on the second surface 1b side of the semiconductor substrate 1 can be removed by immersing a portion of the semiconductor substrate 1 on the second surface 1b side in an aqueous solution of hydrofluoric-nitric acid. A region having a p-type conductivity can thereby be exposed on the second surface 1b of the semiconductor substrate 1. Then, the phosphorus glass, which has adhered to the first surface 1a side of the semiconductor substrate 1 during the formation of the second semiconductor layer 3, is then removed by etching. Removal of and damage to the second semiconductor layer 3 on the first surface 1a side can be reduced by removing the second semiconductor layer formed on the second surface 1b side by etching in a state of allowing the phosphorus glass to remain on the first surface 1a side of the semiconductor substrate 1 as described above. At this time, the second semiconductor layer formed on the end face 1c side of the semiconductor substrate 1 may also be removed.

For example, a diffusion mask may be formed in advance on the second surface 1b side of the semiconductor substrate 1 to form the second semiconductor layer 3 by gas phase thermal diffusion and the like, and then the diffusion mask may be removed. In this case, since the second semiconductor layer is not formed on the second surface 1b side, the process of removing the second semiconductor layer on the second surface 1b side is unnecessary.

The semiconductor substrate 1 including the first semiconductor layer 2 on which the second semiconductor layer 3 as the n-type semiconductor layer located on the first surface 1a side and the texture is present on the first surface 1a can be prepared in the above-mentioned treatment.

1-3-2. Formation of Passivation Layer and So On

In step ST2, a process of forming the passivation layer 4 and the like (also referred to as a second process) is performed. In the first embodiment, the passivation layer 4 is formed at least on the second surface 1b of the semiconductor substrate 1.

Figure 11D:
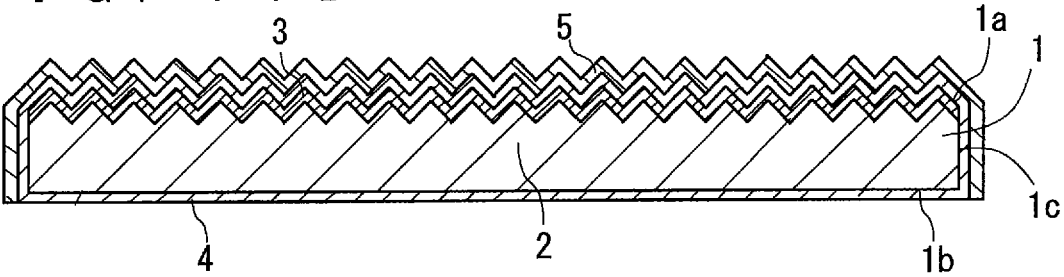

Here, for example, as shown in FIG. 11D, the passivation layer 4 mainly containing aluminum oxide is formed on the second surface 1b of the first semiconductor layer 2 and on the first surface 1a of the second semiconductor layer 3. Further, the antireflection layer 5 is formed on the passivation layer 4. The antireflection layer 5 contains, for example, a silicon nitride film or the like.

The passivation layer 4 can be formed by, for example, ALD or the like. The passivation layer 4 can be formed by ALD on the entire surface including the end face 1c of the semiconductor substrate 1, for example. In the formation process of the passivation layer 4 by ALD, the semiconductor substrate 1 in which the second semiconductor layer 3 has been formed is first placed in a chamber of a layer formation apparatus. The following processes A to D are repeated a plurality of times while heating the semiconductor substrate 1 to a temperature range of 100° C. to 250° C. to form the passivation layer 4 mainly containing the aluminum oxide. The passivation layer 4 having a desired thickness is thereby formed.

[Process A] An aluminum material, such as trimethylaluminum (TMA), for formation of an aluminum oxide is supplied to the semiconductor substrate 1 along with a carrier gas such as an Ar gas and a nitrogen gas. The aluminum material is thereby absorbed onto the entire surface of the semiconductor substrate 1. A time to supply the TMA may be approximately from 15 msec to 3,000 msec, for example. The surface of the semiconductor substrate 1 may be terminated by the OH group at the start of the process A. In other words, the surface of the semiconductor substrate 1 may have an Si—O—H structure. This structure can be formed by cleaning the semiconductor substrate 1 with pure water after treatment with diluted hydrofluoric acid, for example.

[Process B] The chamber of the layer formation apparatus is purified with a nitrogen gas to remove the aluminum material in the chamber. An aluminum material other than a component chemically absorbed at an atomic layer level is further removed from the aluminum material physically and chemically absorbed onto the semiconductor substrate 1. A period of time for the chamber to be purified with the nitrogen gas may be, for example, approximately from one second to dozens of seconds.

[Process C] An oxidizer such as water or an ozone gas is supplied into the chamber of the layer formation apparatus to remove the alkyl group included in TMA so that the OH group is substituted for the alkyl group. An atomic layer of an aluminum oxide is thereby formed on the semiconductor substrate 1. A period of time for the oxidizer to be supplied into the chamber may be, for example, approximately from 750 milliseconds to 1,100 milliseconds. Hydrogen atoms are easily included in the aluminum oxide by supplying hydrogen along with the oxidizer into the chamber, for example.

[Process D] The chamber of the layer formation apparatus is purified with a nitrogen gas to remove the oxidizer in the chamber. Here, for example, an oxidizer not having contributed to reaction during formation of the aluminum oxide at the atomic layer level on the semiconductor substrate 1 is removed. Here, a period of time for purifying the chamber with the nitrogen gas may be, for example, approximately from one second to dozens of seconds.

A series of process in which the process A to the process D are performed in this order as described is thereafter repeated a plurality of times to form the aluminum oxide layer having a desired thickness.

The antireflection layer 5 is formed by PECVD or sputtering, for example. If PECVD is applied, the semiconductor substrate 1 is preheated to a temperature higher than a temperature at which the antireflection layer 5 is formed. Then, a mixed gas of silane ($SiH_4$) and ammonia ($NH_3$) is diluted with nitrogen ($N_2$) gas. The diluted gas is plasmatized by glow discharge decomposition at a reaction pressure of approximately from 50 Pa to 200 Pa, and deposited on the heated semiconductor substrate 1. The antireflection layer 5 is thereby formed on the semiconductor substrate 1. Here, for example, the layer forming temperature is approximately from 350° C. to 650° C., and the preheating temperature of the semiconductor substrate 1 is set higher than the layer forming temperature by approximately 50° C. For example, a frequency of approximately from 10 kHz to 500 kHz is adopted as a frequency of high-frequency power supply required for glow discharge. A flow rate of the gas is appropriately determined in accordance with the size of the reaction chamber and the like. The flow rate of the gas ranges approximately from 150 ml/min (sccm) to 6,000 ml/min (sccm), for example. At this time, a value (B/A) of the flow rate B of ammonia gas divided by the flow rate A of silane gas ranges from 0.5 to 1.5.

1-3-3. Formation of Protective Layer

In step ST3, a process of forming the protective layer 6 (also referred to as a third process) is performed. For example, at least on the second surface 1*b* side of the semiconductor substrate 1, the protective layer 6 having a pattern including the first gap portion G1, the second gap portion G2, and the third gap portion G3 is formed on the passivation layer 4. The protective layer 6 is formed, for example, on the passivation layer 4 formed on the second surface 1*b* of the semiconductor substrate 1 by a wet process using application of a solution or the like or a dry process using PECVD, sputtering, or the like.

Here, for example, it is assumed that a dry process using a photolithography method or the like is adopted. In this case, first, on the second surface 1*b* side of the semiconductor substrate 1, a photoresist is arranged in advance as a mask at least on a portion of the passivation layer 4 on which the protective layer 6 is not formed. Here, the portions on which the protective layer 6 is not formed are portions corresponding to the first gap portion G1, the second gap portion G2, and the third gap portion G3. Next, the protective layer 6 is formed by a method such as PECVD or sputtering. Thereafter, by removing the photoresist, the protective layer 6 having the pattern including the first gap portion G1, the second gap portion G2, and the third gap portion G3 is formed.

Here, for example, it is assumed that a wet process using application of a solution or the like is adopted. In this case, at least on the second surface 1*b* side of the semiconductor substrate 1, the protective layer 6 is formed by applying a solution so as to form a pattern including the first gap portion G1, the second gap portion G2, and the third gap portion G3 on the passivation layer 4 and drying this solution. At this time, for example, an insulation paste is used as a solution.

Figure 11E:
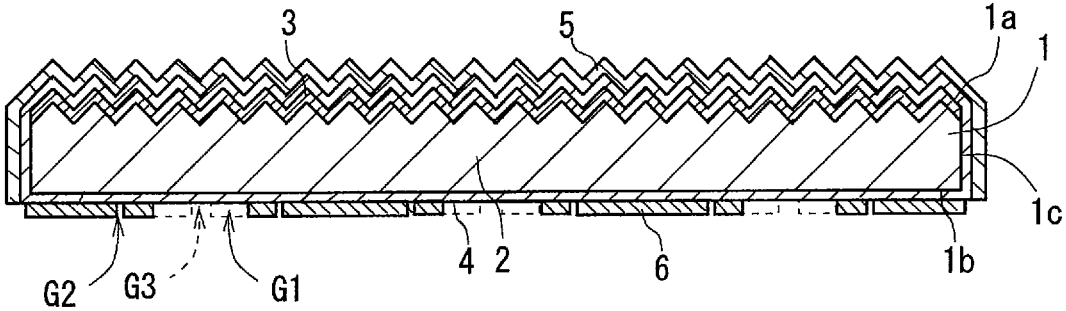

Here, for example, as shown in FIG. 11E, the protective layer 6 is formed on at least a part of the passivation layer 4. For example, first, the above-described insulation paste is applied in a desired pattern to at least a part of the passivation layer 4 using screen printing or the like. The applied insulation paste is dried under the conditions of the maximum temperature of approximately from 150° C. to 350° C. and a heating time of approximately from 1 minute to 10 minutes, using a hot plate, a drying oven, or the like. The protective layer 6 having a desired pattern is thereby formed on the passivation layer 4.

Figure 10:
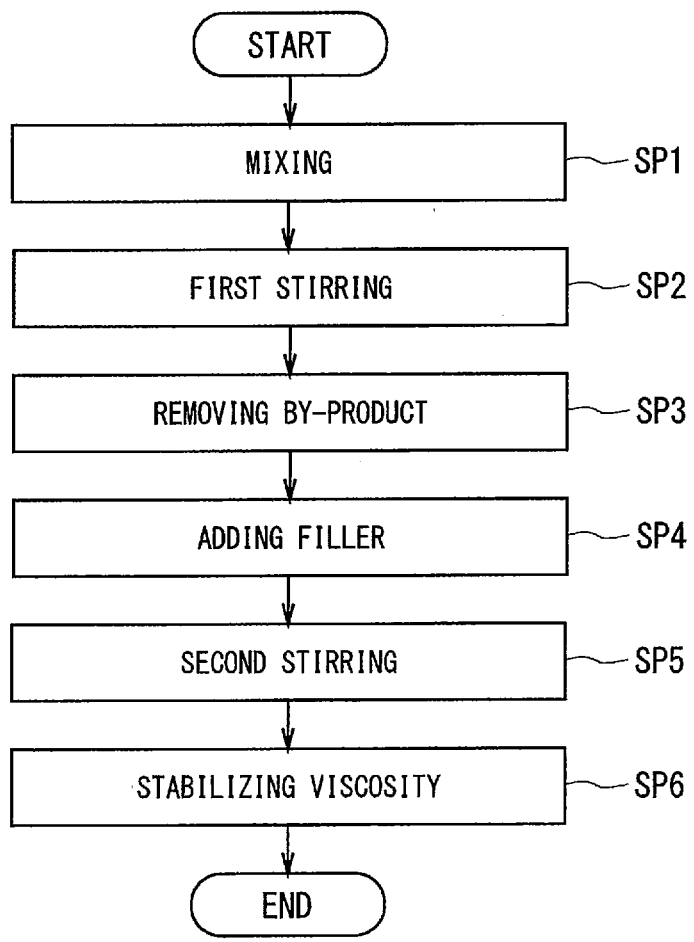
FIG. 10 illustrates a flowchart showing an example of a flow of a method of producing an insulation paste.

Here, the insulation paste can be produced by performing the process of step SP1 to step SP6 shown in FIG. 10 in this order, for example.

In step SP1, a process of preparing a mixed solution by mixing a precursor of siloxane resin, water, an organic solvent, and a catalyst in a container (also referred to as a mixing process) is performed. As the precursor of the siloxane resin, for example, a silane compound having a Si—O bond, a silazane compound having a Si—N bond, or the like can be adopted. These compounds have hydrolytic properties (also referred to as hydrolysable properties). In addition, the precursor of the siloxane resin turns into a siloxane resin through hydrolysis and condensation polymerization.

The silane compound is expressed by the following general formula 1.

$$(R1)_n Si(OR2)_{(4-n)} \qquad \text{(general formula 1)}.$$

In the general formula 1, n is any of the integers from 1 to 4, for example. R1 and R2 in the general formula 1 denote alkyl groups such as a methyl group and an ethyl group or hydrocarbon groups such as a phenyl group.

Here, the silane compound includes, for example, a silane compound in which at least R1 contains an alkyl group (also referred to as an alkyl group-based silane compound). Examples of the alkyl group-based silane compound include methyltrimethoxysilane ($CH_3$—Si—$(OCH_3)_3$) and the like. Here, for example, if the alkyl group is a methyl group, an ethyl group, or a propyl group, alcohol as a by-product having a small number of carbon atoms and easily volatilizing when hydrolyzing the precursor of the siloxane resin can be generated. As a result, by-products tend to be removed in the by-product removing process described later. As a result, for example, when forming the protective layer 6, generation of vacancies due to evaporation of by-products is reduced, so that the protective layer 6 becomes dense and the barrier function of the protective layer 6 can be improved.

Also, the silane compound includes, for example, silane compounds in which R1 and R2 contain both a phenyl group and an alkyl group. Examples of such a silane compound include phenyltrimethoxysilane ($C_6H_5$—Si—$(OCH_3)_3$) and the like. Among such silane compounds, for example, if a silane compound containing two or more OR bonds is adopted, the number of siloxane bonds (Si—O—Si bonds) generated by generating condensation polymerization after hydrolysis of the silane compound can increase. This can increase the network of siloxane bonds in the silicon oxide forming the protective layer 6. As a result, the barrier function of the protective layer 6 can be improved.

In addition, the silazane compound may be either an inorganic silazane compound or an organic silazane compound. Here, examples of inorganic silazane compound include polysilazane (—($H_2SiNH$)—). Examples of organic silazane compound include hexamethyldisilazane (($CH_3$)$_3$—Si—NH—Si—$(CH_3)_3$) and the like.

Water is a liquid used for causing hydrolysis of the precursor of the siloxane resin. For example, pure water is used as water. For example, water reacts with the bond of Si—$OCH_3$ of the silane compound, thereby generating Si—OH bond and HO—$CH_3$ (methanol).

The organic solvent serves as a solvent for producing a paste containing siloxane resin from the precursor of the siloxane resin. In addition, the organic solvent can mix water with the precursor of the siloxane resin. For example, diethyleneglycolmonobutylether or the like is used as the organic solvent.

The catalyst can control a reaction rate during hydrolysis and condensation polymerization of the precursor of the siloxane resin. For example, when Si—OR bonds (for example, R is the alkyl group) contained in the precursor of the siloxane resin are caused to undergo condensation polymerization, the catalyst can adjust the rate of the reaction of production of Si—O—Si bonds and $H_2O$ (water) from two or more Si—OH. As the catalyst, for example, at least one type of inorganic acid among hydrochloric acid, nitric acid, sulfuric acid, boric acid, phosphoric acid, hydrofluoric acid, and the like or at least one type of organic acid such as acetic acid can be used. As the catalyst, for example, at least one type of an inorganic base among ammonia, sodium hydroxide, potassium hydroxide, barium hydroxide, calcium hydroxide, and the like or at least one type of an organic base such as pyridine may be used.

The mixing percentage of the materials mixed together in the mixing process is approximately from 10% by mass to 90% by mass of the concentration of the precursor of the siloxane resin in the mixed solution after mixing all the materials, for example. In this mixed solution, for example, the concentration of the water is approximately from 5% by mass to 40% by mass, the concentration of the catalyst is approximately from 1 ppm to 1,000 ppm, and the concentration of the organic solvent is approximately from 5% by mass to 50% by mass. In this mixed solution, the concentration of water may also be approximately from 10% by mass to 20% by mass.

In such the mixing process, the precursor of the siloxane resin reacts with water to start hydrolysis of the precursor of the siloxane resin. The hydrolyzed precursor of the siloxane resin then is caused to undergo condensation polymerization to start generation of the siloxane resin.

In step SP2, a process of stirring the mixed solution prepared in step SP1 (also referred to as a first stirring process) is performed. Here, the mixed solution is stirred with, for example, a mixing rotor or a stirrer. Hydrolysis of the precursor of the siloxane resin further progresses by stirring the mixed solution. The hydrolyzed precursor of the siloxane resin then undergoes condensation polymerization to continuously generate the siloxane resin. In the first stirring process, for example, when the mixed solution is heated, hydrolysis and condensation polymerization of the precursor of the siloxane resin are likely to proceed.

In step SP3, a process of removing by-products from the mixed solution stirred in step SP2 (also referred to as a by-product removing process) is performed. In this process, water, the catalyst, and a by-product of an organic component such as alcohol are volatilized. The by-product is generated by reaction of the precursor of the siloxane resin and water. By removing the by-product, variation of the viscosity of the insulation paste attributable to volatilization of the organic component as a by-product can be reduced in storing the insulation paste or in continuously applying the insulation paste. If the insulation paste is applied using screen printing, an emulsion used in screen plate making becomes less likely to be dissolved by the organic component as a by-product. This can reduce variation of dimensions of a pattern in screen plate making. In addition, condensation polymerization of the precursor of the siloxane resin can be reduced because water and the catalyst are volatilized in the by-product removing process. This can reduce variation of the viscosity of the mixed solution. In the by-product removing process, the stirred mixed solution is treated using a hot plate, a drying oven, or the like under conditions of a treatment temperature ranging from room temperature to approximately 90° C. and the treatment time of approximately from 10 minutes to 600 minutes, for example. At this time, the treatment temperature may also be approximately from 50° C. to 90° C.

In step SP4, a process of adding a filler to the mixed solution from which by-products have been removed in step SP3 (also referred to as a filler adding process) is performed. Here, for example, inorganic fillers containing a silicon oxide, an aluminum oxide, a titanium oxide, and the like can be adopted as the fillers. For example, the filler may be added to the mixed solution so that the concentration of the filler in the mixed solution after the filler is added may be approximately from 3% by mass to 30% by mass. At this time, the concentration of the filler in the mixed solution after the filler is added may also be approximately from 5% by mass to 25% by mass. The viscosity of the mixed solution can be easily adjusted by performing the filler adding process after the first stirring process.

In step SP5, a process of stirring the mixed solution to which the filler is added in step SP4 (also referred to as a second stirring process) is performed. Here, the mixed solution is stirred with, for example, a rotation and revolution mixer. Due to this, the fillers can uniformly be dispersed in the mixed solution.

In step SP6, a process of stabilizing the viscosity of the mixed solution stirred in step SP5 (also referred to as a viscosity stabilizing process) is performed. The mixed solution is herein kept in storage, for example, at room temperature for approximately from 2 hours to 24 hours, thereby stabilizing the viscosity of the mixed solution. Due to this, the insulation paste is prepared. When the viscosity of the insulation paste is adjusted herein approximately from 5 Pa·sec to 400 Pa·sec at a shearing speed of 1/sec, for example, bleeding can be reduced in applying the insulation paste using screen printing. The viscosity of the insulation paste can be measured using a viscosity-viscoelasticity measuring instrument, for example.

In the series of the processes from step SP1 to step SP6, the viscosity stabilizing process can be omitted if the viscosity of the mixed solution is stabilized in the second stirring process, for example. Further, for example, addition of the filler may be performed in the mixing process. In this case, the filler adding process and the second stirring process are unnecessary. It is not necessary to perform the by-product removing process in a case of applying the insulation paste by spraying or the like using a mask when forming the protective layer 6, for example. For example, a mixed solution containing the precursor of the siloxane resin containing an alkyl group may be generated in the mixing process, and then a siloxane resin containing a phenyl group may be added to the mixed solution in a filler adding process.

1-3-4. Formation of Electrode

Figure 9:
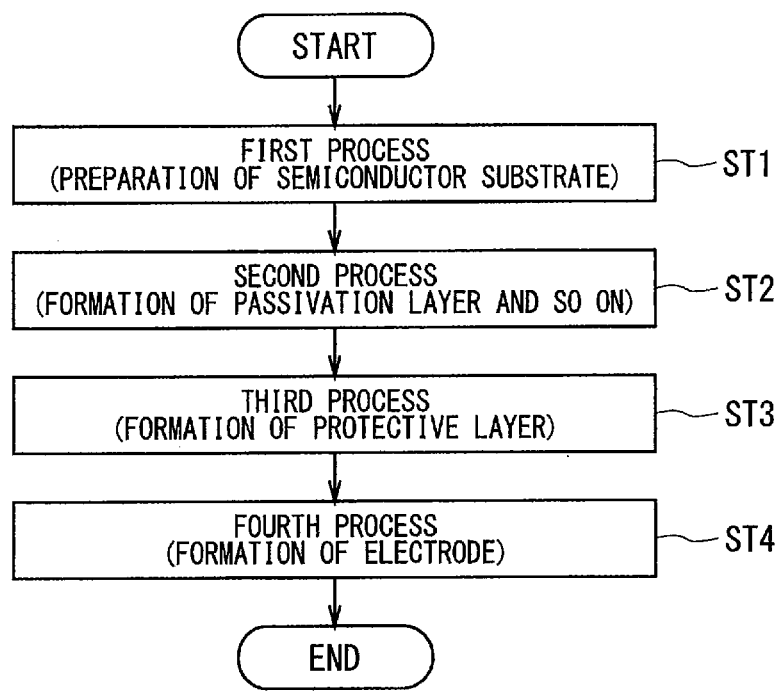
FIG. 9 illustrates a flowchart showing an example of a flow of a method of manufacturing a solar cell element.

In step ST4 of FIG. 9, a process of forming an electrode including the front-surface electrode 7 and the back-surface electrode 8 (also referred to as a fourth process) is performed. Here, materials for electrode formation are disposed, for example, on the protective layer 6, in the first gap portion G1, and in the second gap portion G2, and the materials for electrode formation are heated, thereby forming the back-surface electrode 8. At this time, for example, the materials for electrode formation are not disposed in the third gap portion G3, and the materials for electrode formation are disposed so that the fourth gap portion G4 is formed. In the first embodiment, a silver paste and an A1 paste are adopted as materials for electrode formation. The back-surface electrode 8 formed at this time includes the back-surface bus bar electrode 8a and the back-surface collecting electrode 8b. The back-surface collecting electrode 8b includes the electrode layer portion 8be located on the protective layer 6, the first connecting portion 8bc1 located in the first gap portion G1 and electrically connected to the semiconductor substrate 1, and the second connecting portion 8bc2 located in the second gap portion G2 and electrically connected to the semiconductor substrate 1.

Figure 11F:
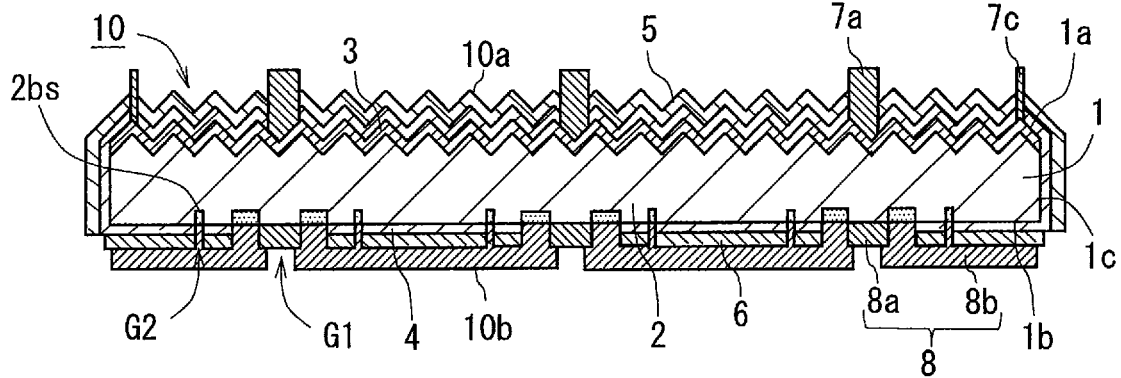
FIG. 11F illustrates a cross-sectional view showing an example of a cross section in a state where the solar cell element has been manufactured.

Here, for example, as shown in FIG. 11F, the front-surface electrode 7 and the back-surface electrode 8 are formed.

The front-surface electrode 7 is prepared using, for example, a silver paste. First, the silver paste is applied to the first surface 1a side of the semiconductor substrate 1. In the first embodiment, the silver paste is applied on the antireflection layer 5 formed on the passivation layer 4 on the first surface 1a. Here, the application of the silver paste can be realized by, for example, screen printing or the like. After the application of the silver paste, the silver paste may be dried by vaporizing of a solvent in the silver paste at a predetermined temperature. For example, the front-surface bus bar electrode 7a, the front-surface collecting electrode 7b, and the auxiliary electrode 7c included in the front-surface electrode 7 can be formed in one process if the silver paste is applied by screen printing. Then, the front-surface electrode 7 is formed by firing the silver paste in a firing oven under conditions of the maximum temperature of approximately from 600° C. to 850° C. and a heating time of approximately from dozens of seconds to dozens of minutes, for example.

The back-surface bus bar electrode 8a included in the back-surface electrode 8 is prepared using a silver paste, for example. As a method of applying the silver paste to the semiconductor substrate 1, for example, screen printing or the like can be used. At this time, for example, in the first gap portion G1, the silver paste is applied to a position away from the protective layer 6 across the gap region G1a. After the application of the silver paste, the silver paste may be dried by vaporizing a solvent in the silver paste at a predetermined temperature. Then, the back-surface bus bar electrode 8a is formed on the second surface 1b side of the semiconductor substrate 1 by firing the silver paste in a firing oven under conditions of the maximum temperature of approximately from 600° C. to 850° C. and a heating time of approximately from dozens of seconds to dozens of minutes.

The back-surface collecting electrode 8b included in the back-surface electrode 8 is prepared using an A1 paste, for example. First, the A1 paste is applied on the second surface 1b side of the semiconductor substrate 1 to be in contact with a portion of the silver paste applied in advance. In the first embodiment, the A1 paste is applied onto the protective layer 6 formed on the passivation layer 4 on the second surface 1b, in the first gap portion G1, and in the second gap portion G2. At this time, for example, the A1 paste is not applied in the third gap portion G3, and the A1 paste is applied so that the fourth gap portion G4 is formed. The application of the A1 paste can herein be implemented by, for example, screen printing or the like. Here, after the application of the A1 paste, the A1 paste may be dried by vaporizing a solvent in the A1 paste at a predetermined temperature. The A1 paste is then fired, for example, in a firing oven under conditions of the maximum temperature of approximately from 600° C. to 850° C. and the heating time of approximately from dozens of seconds to dozens of minutes to form the back-surface collecting electrode 8b on the second surface 1b side of the semiconductor substrate 1.

At this time, the A1 paste causes firing penetration of the passivation layer 4 and is electrically connected with the first semiconductor layer 2, thereby forming the back-surface collecting electrode 8b. At this time, the third semiconductor layer 2bs is formed together with the back-surface collecting electrode 8b. At this time, however, the A1 paste disposed on the protective layer 6 is blocked by the protective layer 6. The passivation layer 4 blocked by the protective layer 6 has little adverse effect due to firing during firing of the A1 paste.

In the first embodiment, for example, the back-surface bus bar electrode 8a may be formed after forming the back-surface collecting electrode 8b. The front-surface electrode 7 and the back-surface electrode 8 may be formed by applying these metal pastes and then simultaneously firing. This can improve the productivity of the solar cell element 10. In addition, in this case, since the heat history provided to the semiconductor substrate 1 is reduced, the output characteristics of the solar cell element 10 can be improved.

1-4 Summary of First Embodiment

In the solar cell element 10 according to the first embodiment, for example, the back-surface collecting electrode 8b is directly connected with the semiconductor substrate 1 in the first gap G1 between the back-surface bus bar electrode 8a and the protective layer 6 and the passivation layer 4. In other words, since the passivation layer 4 and the protective layer 6 are not located immediately below the back-surface bus bar electrode 8a, the back-surface collecting electrode 8b is directly connected with the semiconductor substrate 1 in a portion immediately next to the back-surface bus bar electrode 8a. At this time, the back-surface collecting electrode 8b can be connected with the second surface 1b in the vicinity of the inner edge portion of the back-surface collecting electrode 8b on the back-surface bus bar electrode 8a side. Due to this, for example, in the PERC type solar cell element 10, the adhesion of the back-surface collecting electrode 8b with respect to the semiconductor substrate 1 can be improved. As a result, for example, the reliability of the PERC type solar cell element 10 can be improved.

2. Others

The present disclosure is not limited to the above-described first embodiment, and various modifications and improvements are possible without departing from the scope of the present disclosure.

In the first embodiment, for example, the gap region G1a may be present in at least one of the width direction of the back-surface bus bar electrode 8a. For example, at least one of the gap region G1a on the +X direction side of the back-surface bus bar electrode 8a and the gap region G1a on the −X direction side of the back-surface bus bar electrode 8a may be present.

In the first embodiment, for example, the third gap portion G3 may be present in at least one of the longitudinal direction of the back-surface bus bar electrode 8a. For example, at least one of the third gap portion G3 on the +Y direction side of the back-surface bus bar electrode 8a and the third gap portion G3 on the −Y direction side of the back-surface bus bar electrode 8a may be present. At this time, for example, the fourth gap portion G4 may be present in at least one of the longitudinal direction of the back-surface bus bar electrode 8a. For example, in a case where the third gap portion G3 on the +Y direction side of the back-surface bus bar electrode 8a is present, a structure in which the fourth gap portion G4 superimposed on the third gap portion G3 in perspective plan view is conceivable. Further, for example, in a case where the third gap portion G3 on the −Y direction side of the back-surface bus bar electrode 8a is present, a structure in which the fourth gap portion G4 superimposed on the third gap portion G3 in perspective plan view is conceivable.

In the first embodiment, for example, the back-surface bus bar electrode 8a may be constituted by a single portion located in a state of extending along the longitudinal direction of the back-surface bus bar electrode 8a. That is, for example, the back-surface bus bar electrode 8a may have a configuration including one or more electrode portions along the longitudinal direction. In this case, for example, the protective layer 6 may be located in a state of sandwiching the third gap portion G3 with at least one electrode portion in the longitudinal direction of the back-surface bus bar electrode 8a. Also, in this case, for example, the back-surface collecting electrode 8b may be located in a state of sandwiching the fourth gap portion G4 with at least one electrode portion in the longitudinal direction of the back-surface bus bar electrode 8a.

It is needless to mention that all or part of each of the above-described first embodiment and the various modifications can be combined as appropriate in a range not inconsistent.

The invention claimed is:

1. A solar cell element comprising:
a semiconductor substrate having a first surface and a second surface opposite the first surface;
a passivation layer in contact with the second surface;
a protective layer located on the passivation layer;
a back-surface bus bar electrode that is located on the second surface and is comprised of one or more electrode portions located along a second direction along the second surface that intersects a first direction along the second surface, wherein a first electrode portion of the one or more electrode portions is in contact with the second surface in a first gap penetrating the passivation layer and the protective layer, wherein the first gap does not include the passivation layer or the protective layer, and the passivation layer and the protective layer are not located in the entire area between the first electrode portion and the second surface in a thickness direction of the semiconductor substrate, and the first electrode portion and the passivation layer, as well as the first electrode portion and the protective layer, sandwich a gap region between the first electrode portion located on a first side of the gap region which is a part of the first gap and the passivation layer and the protective layer located on a second side opposite to the first side of the gap region in a first direction, and the gap region and the first electrode portion are in contact with each other in the first direction; and
a back-surface collecting electrode that is electrically connected with the back-surface bus bar electrode, wherein the back-surface collecting electrode includes an electrode layer portion located on the protective layer, a first connecting portion that is located in the gap region and that connects the electrode layer portion and the second surface and is in contact with the first electrode portion, and a second connecting portion that is located in a second gap penetrating the passivation layer and the protective layer and different from the first gap and that connects the electrode layer portion and the second surface, and the second gap does not include the passivation layer or the protective layer, and
wherein the passivation layer and the protective layer are not present between the first electrode portion and the first connecting portion in the first direction such that the first electrode portion and the first connecting portion directly contact each other in the first direction.

2. The solar cell element according to claim 1, wherein the protective layer and the one electrode portion sandwich a third gap in the second direction,
the protective layer, the back-surface collecting electrode, and the one or more electrode portions are not located in the third gap,
the third gap is in contact with the protective layer and also with the first electrode portion, and the back-surface collecting electrode and the first electrode portion sandwich a fourth gap in the second direction,
the back-surface collecting electrode and the one or more electrode portions are not located in the fourth gap,
the fourth gap is in contact with the back-surface collecting electrode and also with the first electrode portion,
the third gap and the fourth gap are superimposed with each other in perspective plan view of the back-surface collecting electrode and the protective layer, and
in the perspective plan view of the passivation layer, the passivation layer is present in a state of extending to a position where the third gap and the fourth gap are superimposed with each other.

3. The solar cell element according to claim 1, wherein the first connecting portion is thicker than the electrode layer portion.

4. The solar cell element according to claim 1, wherein each of the one or more electrode portions has a concavo-convex structure on a surface of an opposite side to the second surface.

5. The solar cell element according to claim 1, wherein a part of the back-surface collecting electrode is located on a part of each of the one or more electrode portions.

6. The solar cell element according to claim 2, wherein a length L4 of the fourth gap is greater than a length L3 of the third gap in the second direction.

7. The solar cell element according to claim 1, wherein the back-surface bus bar electrode includes silver as a main component, and
the back-surface collecting electrode includes aluminum as a main component.

8. The solar cell element according to claim 2, wherein the fourth gap covers an entire area of the third gap in a plan view, and
the third gap and the fourth gap form a stepped gap.

* * * * *